United States Patent
Fujii et al.

(10) Patent No.: US 7,457,600 B2
(45) Date of Patent: Nov. 25, 2008

(54) VCO DEVICE

(75) Inventors: Takeshi Fujii, Osaka (JP); Kenji Adachi, Aichi (JP); Hiroaki Ozeki, Osaka (JP); Mineyuki Iwaida, Kyoto (JP)

(73) Assignee: Panasonic Corporation, Osaka (JP)

( * ) Notice: Subject to any disclaimer, the term of this patent is extended or adjusted under 35 U.S.C. 154(b) by 456 days.

(21) Appl. No.: 10/526,472

(22) PCT Filed: Jun. 24, 2004

(86) PCT No.: PCT/JP2004/009287

§ 371 (c)(1),
(2), (4) Date: Oct. 26, 2005

(87) PCT Pub. No.: WO2005/002056

PCT Pub. Date: Jan. 6, 2005

(65) Prior Publication Data

US 2006/0128335 A1      Jun. 15, 2006

(30) Foreign Application Priority Data

Jun. 27, 2003    (JP)    ............................. 2003-184169

(51) Int. Cl.
  *H04B 7/00*    (2006.01)
(52) U.S. Cl. .................. 455/258; 455/255; 455/147
(58) Field of Classification Search ................ 455/258, 455/259, 260, 262, 264, 265, 147, 196.1, 455/208, 255; 331/183, 160, 113 R, 44, 331/48, 108 C See application file for complete search history.

(56) References Cited

U.S. PATENT DOCUMENTS

| 4,492,934 | A * | 1/1985 | Sugimoto ............... 331/117 R |
| 4,568,888 | A * | 2/1986 | Kimura et al. ................ 331/10 |
| 6,175,282 | B1 * | 1/2001 | Yasuda ......................... 331/44 |
| 6,995,618 | B1 * | 2/2006 | Boecker ....................... 331/16 |
| 7,015,766 | B1 * | 3/2006 | Guo et al. .................... 331/176 |
| 7,038,552 | B2 * | 5/2006 | Brett et al. ................... 331/183 |
| 2002/0001361 | A1 | 1/2002 | Ueno et al. |
| 2005/0073371 | A1 * | 4/2005 | Brett et al. .................... 331/74 |

FOREIGN PATENT DOCUMENTS

| JP | 06-303134 | 10/1994 |
| JP | 09-102752 | 4/1997 |
| JP | 2001-339295 | 12/2001 |
| JP | 2003-318731 | 11/2003 |

* cited by examiner

*Primary Examiner*—Sonny Trinh
(74) *Attorney, Agent, or Firm*—McDermott Will & Emery LLP

(57) ABSTRACT

VCO (voltage-controlled oscillator) device used for a radio unit such as a television broadcast receiver. A VCO device oscillating in a wide band of oscillation frequency and capable of realizing low power consumption is provided. VCO circuit group 4 oscillates signals of frequencies corresponding to control voltage Vt applied to frequency control voltage terminal 8. LO signal selecting means 3 selects a required output signal from VCO circuit group 4. PLL 6 frequency-divides local signal fvco selected by LO signal selecting means 3, compares a phase thereof with a phase of a reference signal and outputs a signal converted from a phase difference. Loop filter 7 smoothes the output signal from PLL 6, outputs control voltage Vt that is a frequency control voltage and outputs the local-signal selected by signal selecting means 3 to high frequency signal processing means 1.

10 Claims, 19 Drawing Sheets

VCO DEVICE

TECHNICAL FIELD

The present invention relates to a VCO (voltage-controlled oscillator) device mounted on a broadcast receiver and a communication transmitter/receiver, and particularly relates to a VCO device oscillating over a wide band of frequency.

BACKGROUND ART

A VCO device is used in, for example, a broadcast receiver and a communication receiver and used as a circuit that generates a local frequency for tuning any high frequency signal.

FIG. 20 is a circuit block diagram showing a conventional VCO device. In FIG. 20, VCO circuit group 104 oscillates signals of frequencies corresponding to control voltage Vt applied to a frequency control voltage terminal. Current source circuit 105 sets a driving current of an oscillation transistor (not shown) that is an element of VCO circuit group 104. Signal selecting means 103 selects an output signal from VCO circuit group 104 and outputs local signal fvco to a local signal output terminal. PLL 106 frequency-divides local signal fvco selected by signal selecting means 103, compares a phase thereof with a phase of a reference signal, and outputs a voltage signal converted from a phase difference. Loop filter 107 smoothes the output signal taken out of PLL 106 and outputs control voltage Vt that controls an oscillation frequency of local signal fvco.

In a mobile receiver including a mobile telephone, it is useful to prepare a plurality of VCO circuits 104a, 104b and 104c, which oscillate in different frequency ranges, as shown in VCO circuit group 104. It is useful because such a circuit configuration is preferable in achieving downsizing of IC mounted on a mobile receiver or reduction of power consumption, in securing a normal operation at low power supply voltage and in obtaining excellent phase noise characteristics in a wide frequency range.

FIG. 21 shows a relation between frequency control voltage Vt supplied to VCO circuits 104a, 104b and 104c and the oscillation frequencies thereof. In particular, for frequency-converting a-high frequency signal of a wide frequency range for television broadcast receiver, etc. into a first IF signal, a VCO circuit is likewise required to oscillate a local signal of a wide frequency range. In order to satisfy the oscillation frequency of the local signal over a wide range, VCO circuit 104a plays a role in oscillating in a low frequency band as an oscillation frequency range. Furthermore, VCO circuit 104b plays a role in oscillating in a middle frequency band as an oscillation frequency range, and VCO circuit 104c plays a role in oscillating in a high frequency as an oscillation frequency range, respectively. Thus, since each of the VCO circuits plays a role respectively, a predetermined frequency range is oscillated, and thereby required electric characteristics can be obtained.

Note here that prior arts related to this kind is described in, for example, Japanese Patent Unexamined Publication No. 9-102752.

However, when the range of oscillation frequency is intended to be widened by using a conventional VCO device, as shown in FIG. 22, as is apparent from the relation of characteristics between the offset frequency and the phase noise of VCO circuits 104a, 104b and 104C, the signal oscillated by VCO circuit 104a that plays a role in oscillating in a low frequency band of the local signal has a relatively smaller phase noise as compared with VCO circuits 104b and 104c.

This is because Q (Quality factor) of a resonance circuit built in the VCO circuit depends upon the frequency characteristics. As the oscillation frequency is higher, impedance of signal wiring of the circuit or stray capacitance provided to the signal wiring becomes unignorable, and thereby Q is deteriorated. When Q of the resonance circuit is deteriorated, the phase noise is generally increased.

As shown in FIG. 20, according to a conventional VCO device, current source circuit 105 for setting current of oscillation transistors (not shown) prepared for VCO circuits 104a, 104b and 104c was shared by the VCO circuits. Alternatively, when current source circuits 105 are connected individually, the currents thereof were set to substantially the same value.

In such a configuration, the current of current source circuit 105 is set so that required characteristics of, for example, VCO circuit 104c, which has the highest frequency range and is disadvantageous in lowering the phase noise, can be achieved. Therefore, VCO circuits 104a and 104b which are relatively advantageous in lowering the phase noise necessarily operate below the required characteristics of the phase noise characteristics. VCO circuits 104a and 104b satisfy the required phase noise. However, they have to supply undesired excess current, which may lead to an increase in power consumption.

When a VCO device is mounted on a mobile terminal including a mobile telephone, continuous usable time is limited by a battery as a driving power supply. Therefore, it is a very important problem to achieve low power consumption of a broadcast receiver and a communication transmitter/receiver mounted on a mobile terminal.

SUMMARY OF THE INVENTION

It is an object of the present invention to provide a VCO device capable. of achieving both. a wide band of oscillation frequency range and low power consumption, and a receiver using the same.

The VCO device of the present invention includes a plurality of VCO (VOLTAGE CONTROLLED OSCILLATOR) circuits for oscillating signals of frequencies corresponding to control voltage Vt applied to a frequency control voltage terminal, in different oscillation frequency ranges; a current source circuit for respectively setting a driving current of each of oscillation transistors included in the plurality of VCO circuits; a signal selecting means for switching output signals of the VCO circuits; a PLL for frequency-dividing a local signal selected by the signal selecting means, comparing a phase thereof with a phase of a reference signal and outputting a signal converted from a phase difference; and a loop filter for smoothing the output signal from the PLL and outputting control voltage Vt for controlling the oscillation frequency. Thus, it is possible to achieve low power consumption in accordance with the phase noise characteristics with respect to the oscillation frequencies of the individual VCO circuits.

Furthermore, in the VCO device of the present invention, a current capable of obtaining the phase noise equal to that oscillated by a VCO circuit oscillating in the highest oscillation frequency range in the VCO circuits is applied to currents of current source circuits of other plurality of VCO circuits. Thus, particularly, power consumption of the VCO circuit that plays a role in oscillating in a low frequency band can be reduced.

Furthermore, in the VCO device of the present invention, current of the current source circuit for driving the VCO circuit is a variable current source circuit. Thus, the phase noise can be corrected in accordance with the change in a so-called operation environment such as change in a temperature or a change in power supply voltage, or switch of communication specifications of different required characteristics, so that excellent communication characteristics can be obtained.

Furthermore, the VCO device of the present invention includes a plurality of VCO circuits oscillating signals of frequencies corresponding to control voltage Vt applied to a frequency control voltage terminal, and oscillating in different oscillation frequency ranges; a variable current source circuit for respectively setting a driving current of each of the plurality of VCO circuits; a high frequency signal processing means for mixing a local signal output from any one of the plurality of VCO circuits and a received signal input from a high frequency signal input terminal; and a current control means for switching current of the variable current source circuit corresponding to the oscillation frequency output from the VCO circuit group.

According to such a configuration, a phase noise, which changes by Q of a resonance circuit element formed on a VCO circuit or frequency characteristic of parasitic capacitance, etc., can be corrected by the driving current of the oscillation transistor. Thus, a more constant phase noise performance can be obtained over a wide band of a frequency range.

Furthermore, the VCO device of the present invention includes a plurality of VCO circuits for oscillating signals of frequencies corresponding to control voltage Vt applied to a frequency control voltage terminal, in the different oscillation frequency ranges; and current source circuits for respectively setting a driving current of each of the plurality of VCO circuits. In the VCO device, resonance circuits of individual VCO circuits are set so that frequency ranges oscillating in accordance with control voltage Vt applied to a frequency control voltage terminal partially overlap with each other.

Even in the case where relative variation occurs in resonance circuits constituting individual VCO circuits and oscillation frequency ranges set in individual VCO circuits vary in the direction of high frequency/direction of low frequency inconsistently, the range of the required oscillation frequency can be varied continuously into a required oscillation frequency.

Furthermore, the VCO device of the present invention includes a plurality of VCO circuits oscillating signals of frequencies corresponding to control voltage Vt applied to a frequency control voltage terminal, in different oscillation frequencies; and a current source circuit for respectively setting a driving current of each of the plurality of VCO circuits. In the VCO device, resonance circuits of the individual VCO circuits are set so that the oscillation sensitivities by the change in the oscillation frequency corresponding to control voltage Vt are equalized in the individual VCO circuits. The change in capacitance of variable capacitance element is increased due to control voltage Vt, so that the change in the oscillation frequency is increased. By equalizing the influence of the increase in the change of the oscillation frequency on the phase noise in the individual VCO circuits, it is possible to obtain a more constant phase noise performance over a wide band of frequency range.

Furthermore, the VCO device of the present invention includes a plurality of VCO circuits oscillating signals of frequencies corresponding to control voltage Vt applied to a frequency control voltage terminal, in different oscillation frequencies; a current source circuit for respectively setting a driving current of each of the plurality of VCO circuits; a high frequency signal processing means including a MIX circuit (MIX circuit is a circuit for outputting the multiplied two signals with different frequencies) connected to an output side of the VCO circuit and connected to an output side of the high frequency input signal selecting means; a signal selecting means for switching the output signal of the VCO circuit; a PLL for frequency-dividing a local signal selected by the signal selecting means, comparing a phase thereof with a phase of a reference signal and outputting a voltage signal converted from a phase difference; and a loop filter for smoothing the output signal from the PLL and outputting control voltage Vt for controlling the oscillation frequency.

According to such a configuration, a plurality of MIX circuits to which the output signal of the VCO circuit oscillating over a wide band of oscillation frequency range is connected are provided, and signal processing in individual MIX circuits can be carried out in different frequency bands. The increase in current consumption, which has been a problem in widening the frequency band of the MIX circuit, can be removed. Thus, low power consumption can be achieved and excellent communication characteristics can be obtained.

Furthermore, the VCO device of the present invention is a VCO device in which a plurality of low noise amplifiers (hereinafter, which is referred to as "LNA") are connected to a high frequency input signal selecting means.

Thus, when each of the plurality of LNAs has a power supply ON/OFF function, a required high frequency input signal can be selected. Furthermore, it is possible to obtain excellent communication characteristics at low power consumption without increasing current consumption, which has been a problem in widening the frequency band.

Furthermore, in the VCO device of the present invention, the high frequency input signal selecting means is configured by a plurality of LNAs and BPFs (band pass filters).

The plurality of LNAs have power supply ON/OFF functions. Furthermore, the BPF circuit has a tuning function capable of selecting a frequency, thereby enabling the selection of high frequency input signal. Furthermore, when high frequency input signal includes interfering wave depending upon conditions of receiving radio wave, and in particular, when the electric field strength of the interfering wave is strong, by attenuating the interfering wave by the BPF circuit, excellent communication characteristics can be obtained.

The VCO device of the present invention includes a plurality of VCO circuits for oscillating signals of frequencies corresponding to control voltage Vt applied to a frequency control voltage terminal, in different oscillation frequency ranges; a variable current source circuit for respectively setting a driving current of each of the plurality of VCO circuits; a high frequency signal processing means for mixing a local signal output from the plurality of VCO circuits and a receiving signal input from the high frequency signal input terminal; received characteristics judging means for judging received characteristics by carrying out digital demodulation processing of an analog signal output from the high frequency signal processing means; and current control means for a switching current of the variable current source circuit by outputting voltage or current corresponding to the digital signal output from the received characteristics judging means.

Phase noise can be corrected depending upon the change in communication condition of a transmitting/receiving system to be mounted. Thus, excellent communication characteristics can be obtained.

The VCO device of the present invention includes a plurality of VCO circuits for oscillating signals of frequencies corresponding to control voltage Vt applied to a frequency control voltage terminal, in different oscillation frequency ranges; a variable current source circuit for respectively setting a driving current of each of the plurality of VCO circuits; a high frequency signal processing means for mixing a local signal output from the plurality of VCO circuits and a received signal input from a high frequency signal input terminal; a digital modulation system judging means for judging the digital modulation system by carrying out a digital modulation processing of an analog signal output from the high frequency processing means; and a current control means for switching current of the variable current source by outputting voltage or current corresponding to the digital signal output from the digital modulation system judging means.

When broadcasting standard or communication standard to which a mounted transmitting/receiving system corresponds uses a plurality of digital modulation systems, it is possible to achieve low power consumption can be realized on the contrary to amplitude determined by these digital modulation systems or multiplicity on the phase axis.

DETAILED DESCRIPTION OF PREFERRED EMBODIMENTS

Hereinafter, exemplary embodiments of the present invention are described.

First Exemplary Embodiment

Figure 1:
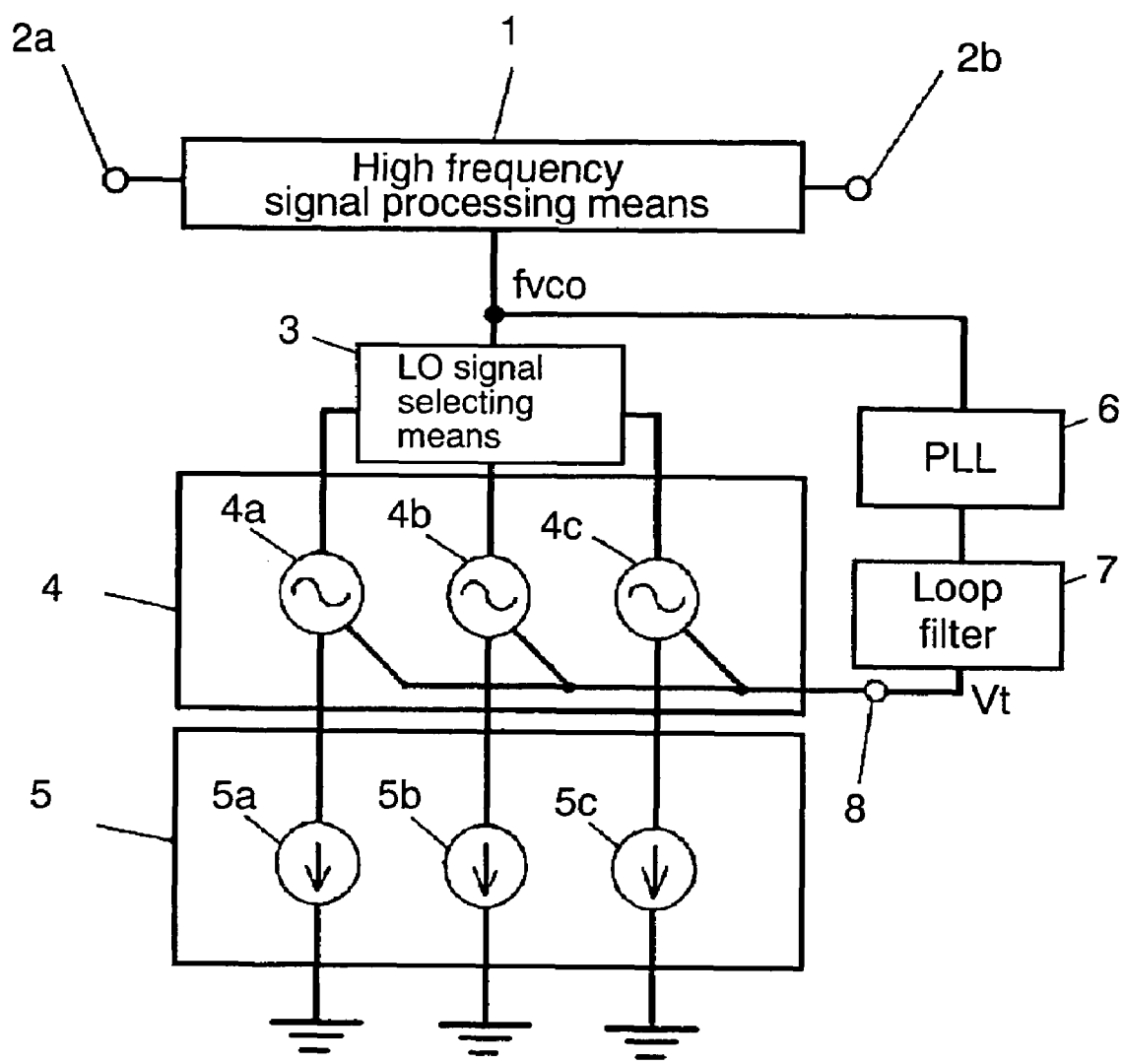
FIG. 1 is a circuit block diagram showing a VCO device of the present invention.

FIG. 1 is a block diagram showing an example of a VCO device of the present invention.

The VCO device of the present invention includes high frequency signal processing means 1. High frequency signal processing means 1 can be applied to, for example, a transmitting/receiving circuit mounted on a mobile terminal unit such as a mobile telephone. High frequency signal processing means 1 is provided with high frequency signal input terminal 2a and high frequency signal output terminal 2b.

Furthermore, the VCO device of the present invention includes VCO circuit group 4. VCO circuit group 4 oscillates signals of frequencies corresponding to control voltage Vt applied to frequency control voltage terminal 8. LO signal selecting means 3 selects a required output signal from VCO circuit group 4. PLL 6 frequency-divides local signal fvco selected by LO signal selecting means 3, compares a phase thereof with a phase of a reference signal, and outputs voltage signal converted from a phase difference. Loop filter 7 smoothes the output signal from PLL 6, outputs control voltage Vt for controlling the oscillation frequency of local signal fvco, and outputs local signal fvco selected by LO signal selecting means 3 to high frequency signal processing means 1.

Note here that a mobile terminal unit is generally required to have small size and low power consumption. Therefore, a VCO device mounted on the mobile terminal unit is naturally required to have small size and low power consumption. Furthermore, the VCO device is generally formed as an IC. Therefore, IC capable of operating normally even in a case where an IC package has a small size and lower power source voltage.

VCO circuit group 4 of the present invention shown in FIG. 1 is preferable in receiving or transmitting a wide band of a frequency range. VCO circuit group 4 includes three VCO circuits, that is, VCO circuit 4a, VCO circuit 4b and VCO circuit 4c. Each of these three VCO circuits is provided with a so-called oscillation transistor (not shown) for oscillating in a predetermined frequency range.

Current source circuit group 5 includes current source circuit 5a, current source circuit 5b and current source circuit 5c. Current source circuit 5a is provided for driving VCO circuit 4a. Similarly, current source circuit 5b and current source circuit 5c are provided for driving VCO circuit 4b and VCO circuit 4c, respectively. Current source circuits 5a, 5b and 5c are set to different current values from each other. That is to say, the current source circuits 5a, 5b and 5c have respective roles and functions for oscillating in frequency ranges which are different from each other.

The VCO device having such a configuration of the present invention can be operated by respectively setting a current corresponding to the phase noise characteristics with respect to the oscillation frequency of the individual VCO circuits oscillating in frequencies which are different from each other. Thus, it is possible to set an optimum value of the phase noise of the individual VCO circuits corresponding to the frequency characteristics or required characteristics of equipment.

Figure 2:
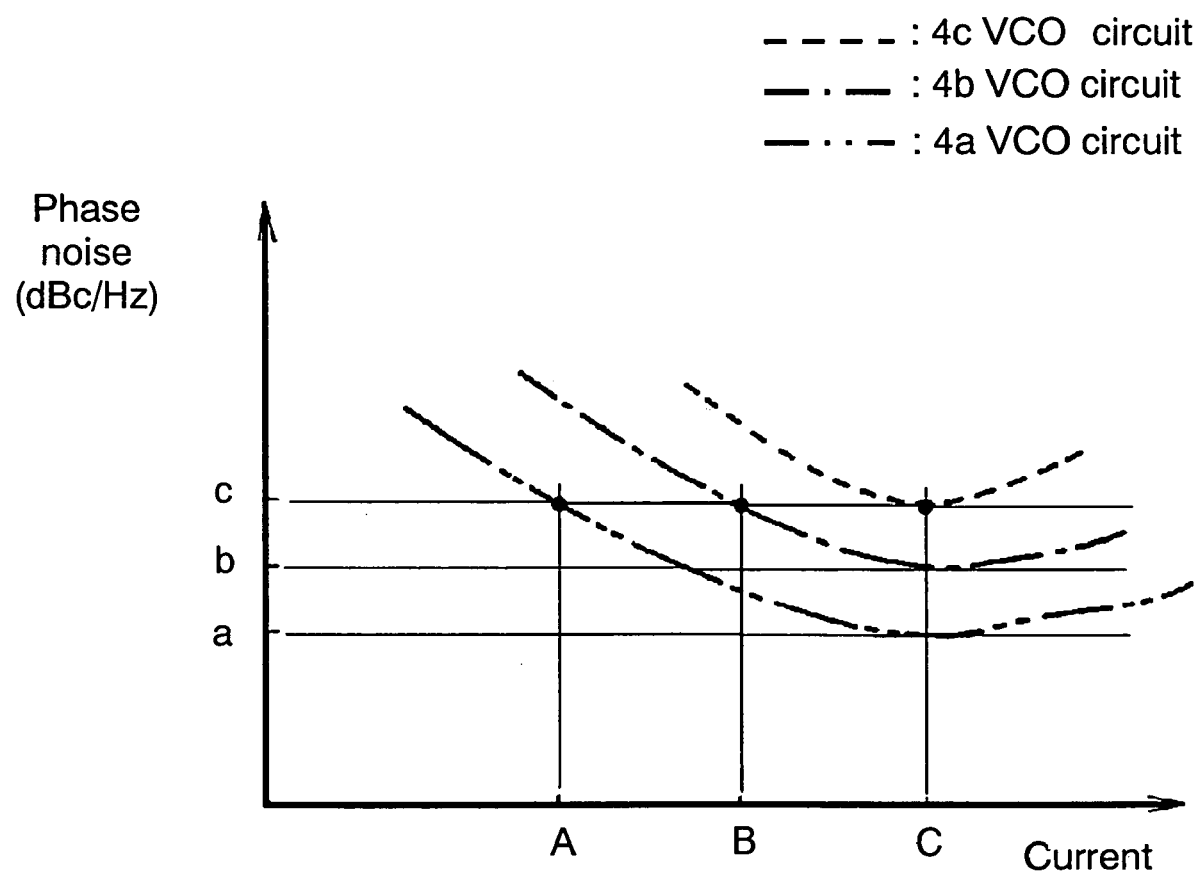
FIG. 2 is a characteristic view showing a relation between a phase noise and a driving current of a VCO circuit of the present invention.

FIG. 2 shows a relation between the above-mentioned phase noise and current A, B and C respectively corresponding to current source circuits 5a, 5b and 5c.

It shows the relation between a phase noise and current values A, B and C set to three VCO circuits oscillating in different frequency ranges, that is, VCO circuit 4a that plays a role in oscillating in a low frequency band, VCO circuit 4b that plays a role in oscillating in a middle frequency band and VCO circuit 4c that plays a role in oscillating in a high frequency band and current source circuits 5a, 5b and 5c driving the three VCO circuits.

Such VCO circuits have to accept the influence of impedance or stray capacitance of the circuit. In particular, VCO circuit 4c that plays a role in oscillating in a high frequency band is most susceptible to the influence. In other words, a VCO circuit that plays a role in oscillating in a low frequency band is more advantageous for achieving low phase noise and is preferable because the current of the current source circuit can be reduced.

Second Exemplary Embodiment

Figure 3:
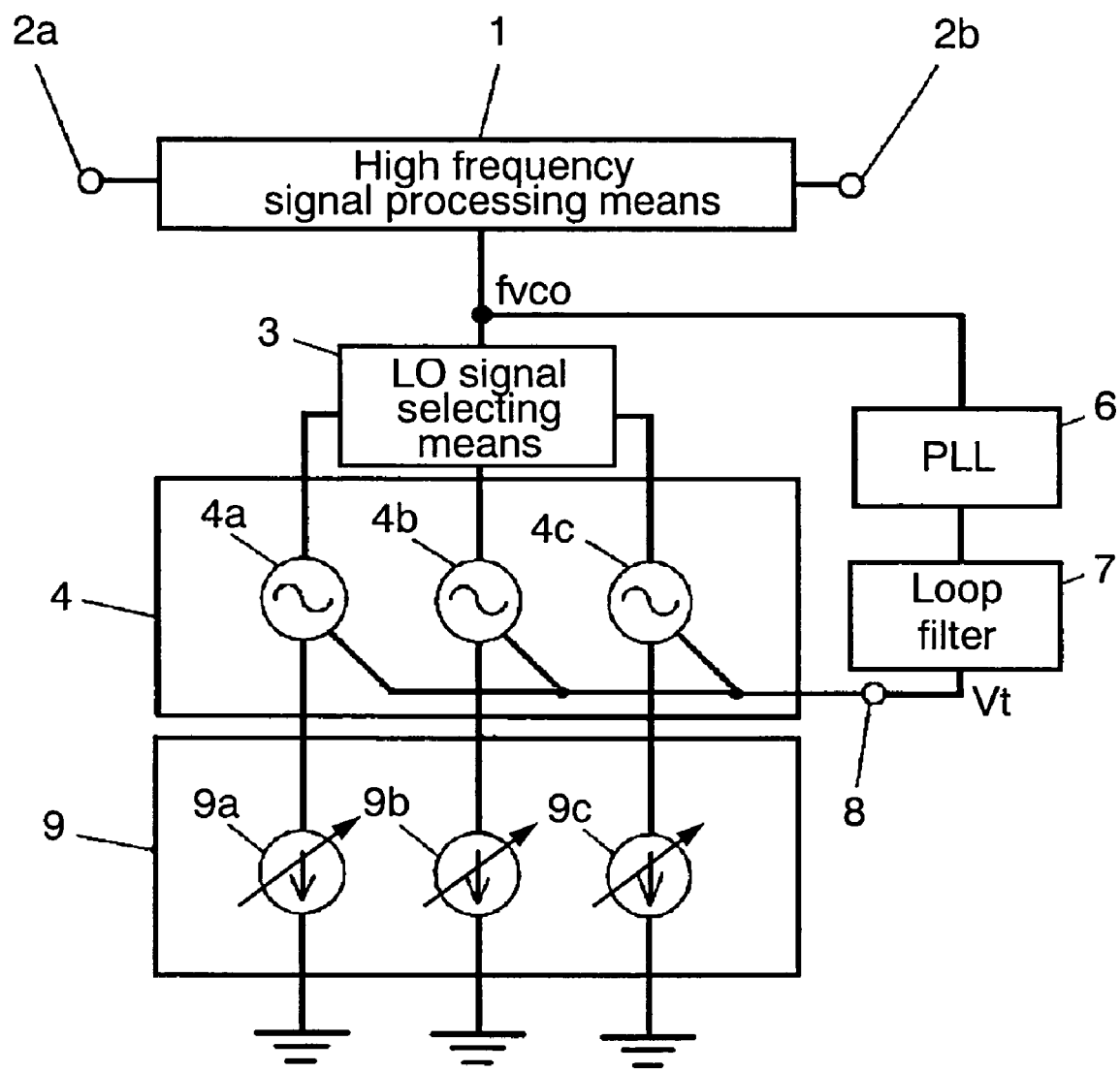
FIG. 3 is a circuit block diagram showing a VCO device in another exemplary embodiment of the present invention.

FIG. 3 is a block diagram showing an example of another configuration of a VCO device according to the present invention. The same or corresponding elements shown in FIG. 1 used for describing the first exemplary embodiment are denoted with the same reference numerals as those therein.

The configuration of VCO circuit group 4 is the same as that in the first exemplary embodiment (FIG. 1). That it to say, VCO circuit group 4 includes VCO circuits 4a, 4b and 4c, which oscillate in different frequency ranges. Current source circuit group 9 is provided for driving VCO circuit group 4. Current source circuit group 9 includes variable current source circuits 9a, 9b and 9c. Variable current source circuit 9a is provided for driving VCO circuit 4a. Similarly, variable current source 9b and variable current source circuit 9c are provided for driving VCO circuit 4b and driving 4c, respectively.

The VCO device shown in FIG. 3 is different from that shown in FIG. 1 in that current source circuit group 9 is a variable current source. The other configurations, that is, the configurations of VCO circuit group 4, high frequency signal processing means 1, LO signal selecting means 3, PLL 6 and loop filter 7 are substantially the same as those shown in FIG. 1, and the detailed description thereof is omitted herein.

Since the VCO circuit device of the present invention shown in FIG. 3 used for describing the second exemplary embodiment includes variable current source circuit 9c, a plurality of required characteristics can be realized in accordance with not only the phase noise characteristics with respect to the oscillation frequencies in which VCO circuits 4a, 4b and 4c are oscillated but also a change in the surrounding operation environment such as a temperature, power source voltage, or the like and communication standard, that is, in accordance with the surrounding environment, electric characteristics such as communication system, communication device, and the like.

Third Exemplary Embodiment

Figure 4:
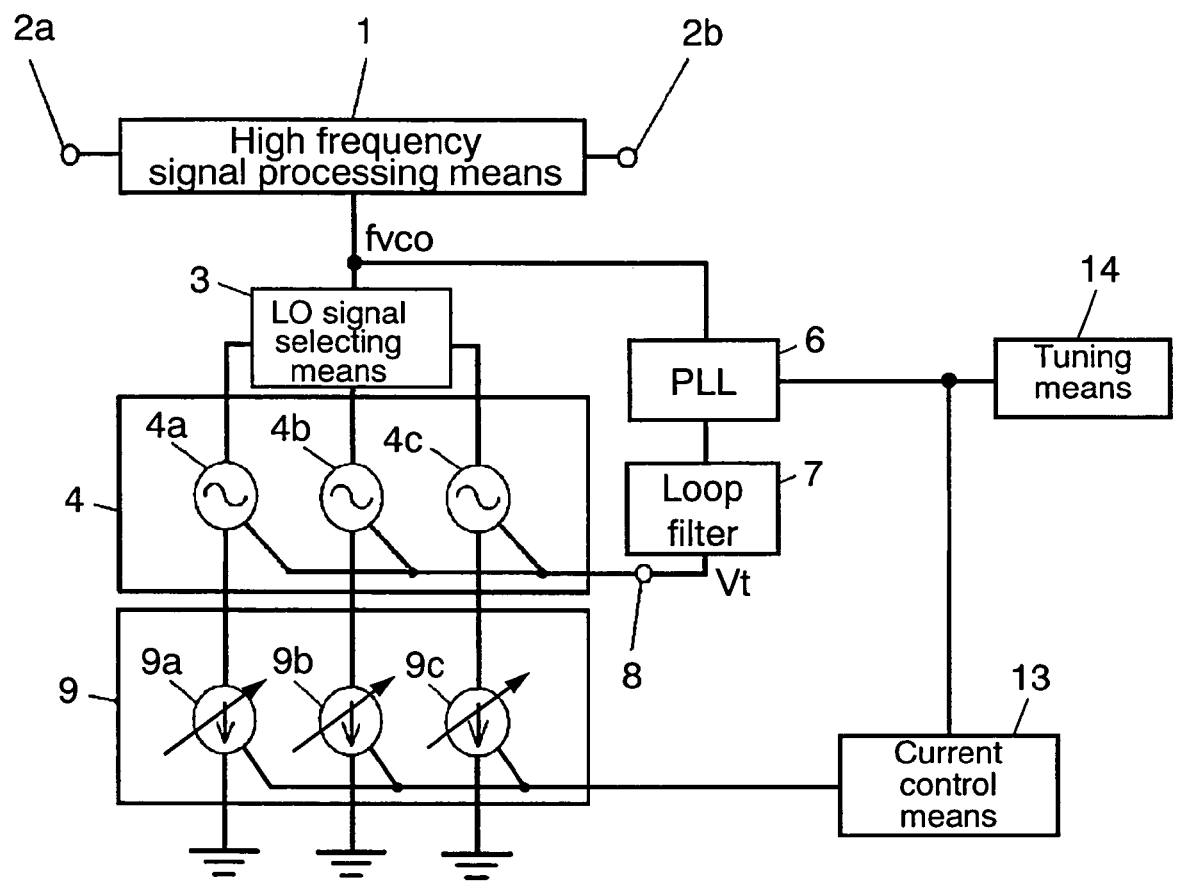
FIG. 4 is a circuit block diagram showing a VCO device in a further exemplary embodiment of the present invention.

FIG. 4 is a block diagram showing an example of a further configuration of a VCO device of the present invention. The same or corresponding elements shown in FIG. 1 used for describing the first exemplary embodiment and shown in FIG. 3 used for describing the second exemplary embodiment are denoted with the same reference numerals as those therein, and the detailed description thereof is omitted herein.

FIG. 4 is different from the above-mentioned two exemplary embodiments in including current control means 13 for controlling each current of variable current circuits 9a, 9b and 9c of current source circuit group 9 corresponding to local signal oscillation frequency fvco and tuning means 14 for controlling the frequency in which the VCO circuit oscillates by setting a frequency-dividing ratio of PLL circuit 6.

Current control means 13 outputs voltage or current signal for controlling currents of current source circuit group 9 corresponding to a frequency dividing ratio setting signal output from tuning means 14. Thus, driving currents of oscillation transistor (not shown) included in VCO circuits 4a, 4b and 4c can be switched.

According to the configuration of the third exemplary embodiment described with reference to FIG. 4, it is possible to obtain a VCO device with substantially the constant phase noise even in a wide band of frequency range.

Fourth Exemplary Embodiment

Figure 5:
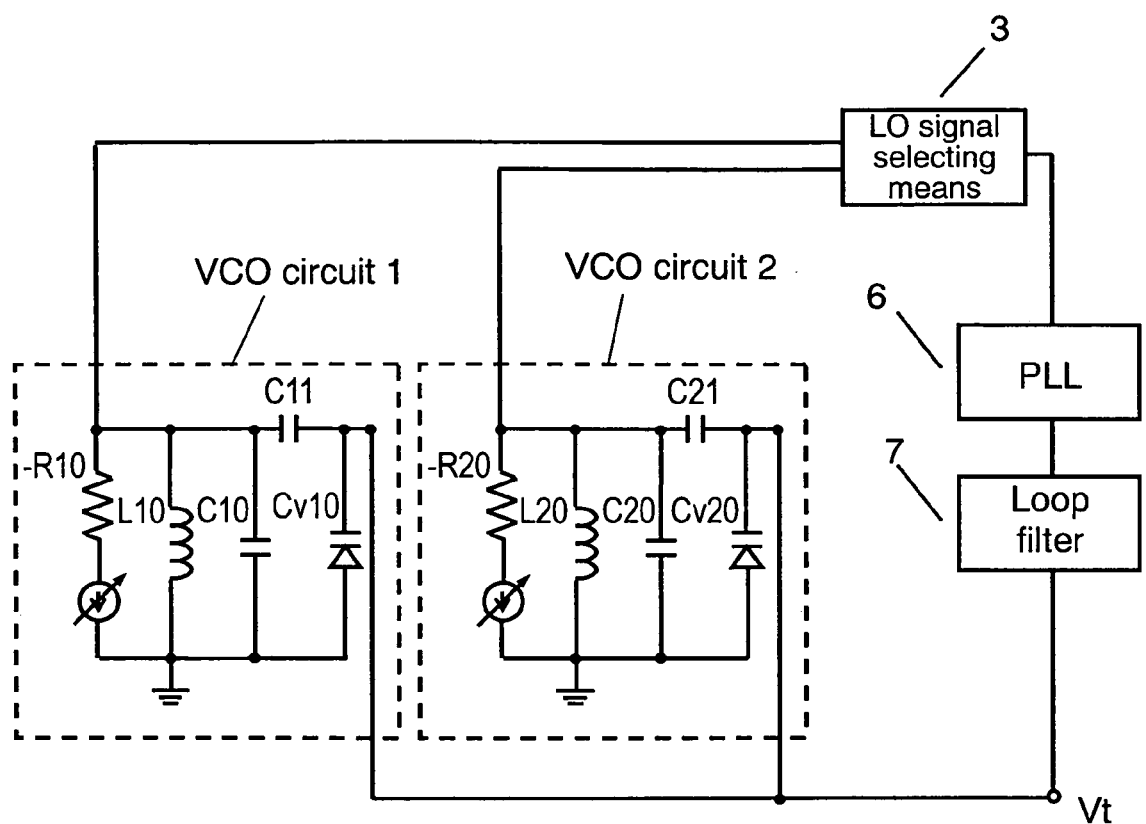
FIG. 5 is a block diagram showing a VCO device using a general resonance circuit.

FIG. 5 is a block diagram showing a VCO device using an example of a general resonance circuit. In particular, it shows a specific circuit configuration of the VCO circuit. Furthermore, a configuration provided with two VCO circuits oscillating in different frequency ranges is exemplified. VCO circuit 1 and VCO circuit 2 are configured by a LC parallel resonance in which a negative resistor portion (−R), an inductor L and a capacitor C are connected in parallel.

A portion where these are connected in parallel is a parallel resonance circuit having a positive element such as a transistor supplied with power supply voltage generating electric power. The negative resistor portion (−R) is different from general resisters in that it generates electric power. Resonance frequency fout by LC parallel resonance can be calculated from the following equation:

$$fout = \tfrac{1}{2}\{\sqrt{L10 \cdot Ctotal}\}$$

Herein, Ctotal denotes a value of a synthesized amount of capacitance of fixed capacitance capacitor C10 and C11 and variable capacitance element Cv20. Ctotal, in a case where the resonance circuit shown in FIG. 5 is configured, can be expressed by the following equation:

$$Ctotal = C10 \cdot \left\{ \frac{C11 \cdot Cv20}{C11 + Cv20} \right\}$$

To change resonance frequency fout, variable capacitance element Cv whose capacitance changes by the potential difference between both terminals is used so as to control capacitance Cv of the variable capacitance element by control voltage Vt output from loop filter 7, thereby enabling oscillation frequency fout to be changed.

Figure 6:
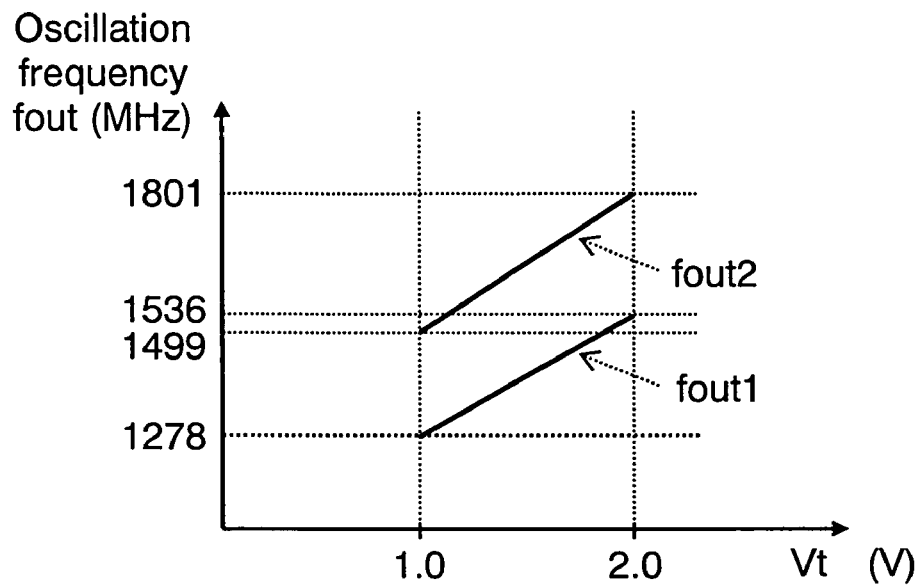
FIG. 6 shows oscillation frequency ranges when variation due to an IC process is ignorable.
Figure 7:
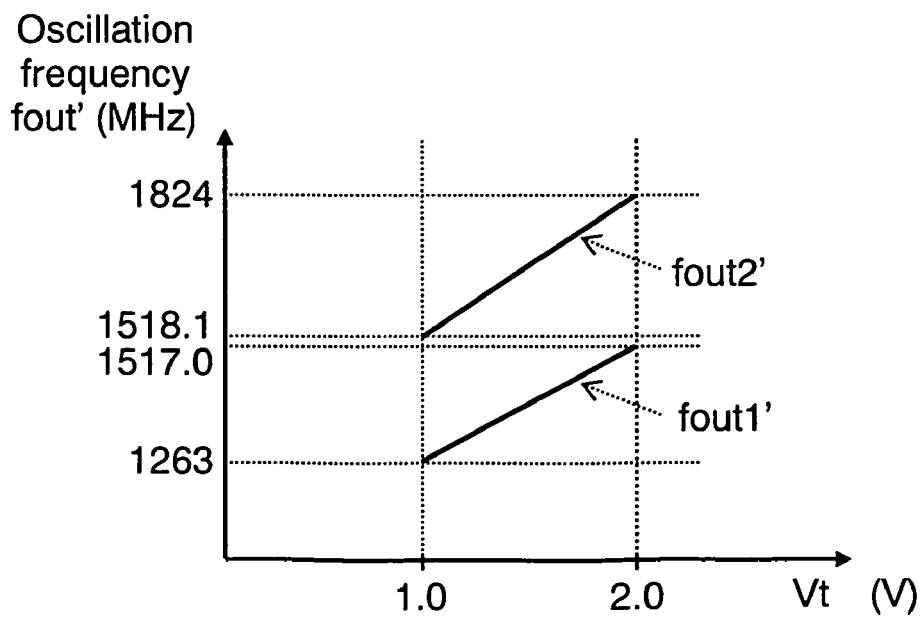
FIG. 7 shows oscillation frequency ranges when variation due to an IC process is not ignorable.

FIGS. 6 and 7 show two oscillation frequency ranges of VCO circuit 1 and VCO circuit 2 shown in FIG. 5. FIG. 6 shows an example of an oscillation frequency range when variation due to an IC process for producing VCO circuits 1 and 2 is ignorable. FIG. 7 shows an example of an oscillation frequency range when variation due to an IC process is not ignorable.

Herein, resonance frequencies fout1 and fout2 of VCO circuit 1 and VCO circuit 2 included in the VCO device shown in FIG. 5 are calculated by using a specific example. When control voltage Vt of variable capacitance element Cv is set to V1=1.0V and V2=2.0V, and voltage Vt is allowed to vary in the range from V1 to V2, the range of the resonance frequency of VCO circuit 1 and VCO circuit 2 are:

when L10=5.5 nH, C10=1.0 pF, C11=20.0 pF, L20=4.0 nH, C20=1.0 pF, C21=20 pF, Cv10=Cv20=2.0 pF (Vt=V1=1.0V) and Cv10=Cv20=1.0 pF (Vt=V2=2.0V), VCO circuit 1: 1278 MHz<fout1<1513 MHz
VCO circuit 2: 1499 MHz<fout2<1801 MHz That is to say, in VCO circuit 1 and VCO circuit 2, corresponding to control voltage Vt applied to frequency control voltage terminal 8, the frequency ranges (1499 MHz to 1536 MHz) of the oscillation frequencies partially overlap with each other.

Then, assuming that 4% (±2%) or 5% (±2.5%) of the relative variation occurred in inductances (H) of inductor L10 and inductor L20 formed on the resonance circuits of VCO circuit 1 and VCO circuit 2, and assuming that 4% (±2%) of the relative variation occurred in the inductance in fout1' and fout2' that is a range of the resonance frequency of VCO circuit 1 and VCO circuit 2 under the same conditions except the inductor, and when L10=5.61 nH=5.5 nH×1.02 (variation of +2%) and
L20=3.92 nH=5.5 nH×0.98 (variation of −2%) are satisfied, VCO circuit 1: 1266 MHz<fout1'<1536 MHz, and
VCO circuit 2: 1522 MHz<fout2'<1829 MHz are obtained.

Furthermore, assuming that the relative variation of the inductance is 5% (2.5%), and when L10=5.64 nH=5.5 nH×1.025 (variation of +2.5%) and
L20=3.90 nH=5.5 nH×0.975 (variation of −2.5%) are satisfied, VCO circuit 1: 1263.0 MHz<fout1'<1517.1 MHz and
VCO circuit 2: 1518.1 MHz<fout2'<1824.0 MHz are obtained.

That is to say, when the relative variation of the inductor is more than 5%, a frequency range (1517.1 MHz to 1518.1 MHz) where neither VCO circuit 1 nor VCO circuit 2 can output is turned out to appear.

In other words, since the oscillation frequency that is not continuously variable occurs due to the relative variation of the inductor, in the VCO device configured by a plurality of VCO circuits, the oscillation frequency ranges, for oscillating signals of frequencies corresponding to control voltage Vt applied to frequency control voltage terminal, partially overlap with each other.

Note here that in the fourth exemplary embodiment, the case where the inductor varies was described. However, the same is true in the case where an element other than the inductor such as a capacitor or a variable capacitance element varies. Therefore, by considering a complex variation of inductor, capacitor and variable capacitance element, the circuit constants of individual VCO circuit 1 and VCO circuit 2 are determined so that the oscillation frequency ranges of the plurality of VCO circuits partially overlap with each other.

Furthermore, the fourth exemplary embodiment described the oscillation frequency range with the relative variation of the inductor of 4% and 5% as an example. However, since the range of variation differs depending upon IC process, it is possible to allow the oscillation frequencies of the plurality of VCO circuits to partially overlap with each other in accordance with the range of variation. This is one of the design matters of individual VCO circuits.

Furthermore, in the fourth exemplary embodiment, the case of using an unbalanced type oscillation circuit was described. Needless to say, an unbalanced type oscillation circuit using a differential amplifying circuit may be used.

Furthermore, in the fourth exemplary embodiment, the variable capacitance element was used, however, any other elements may be used as long as the element can make capacitance values variable by the potential difference between the terminals.

Figure 8:
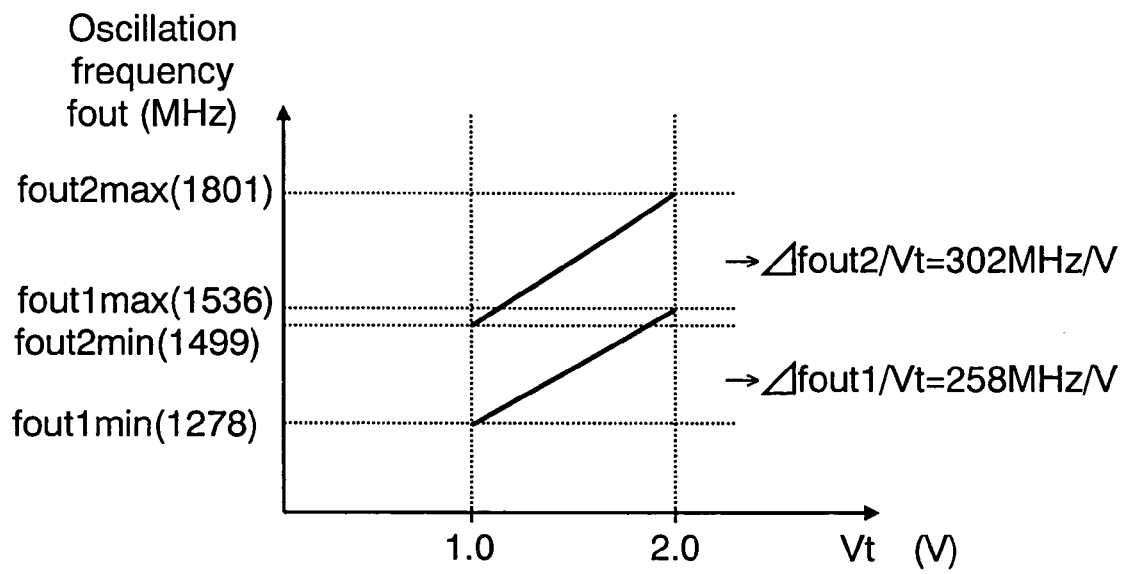
FIG. 8 shows oscillation frequency ranges when oscillation sensitivities are not constant in a plurality of VCO circuits.
Figure 9:
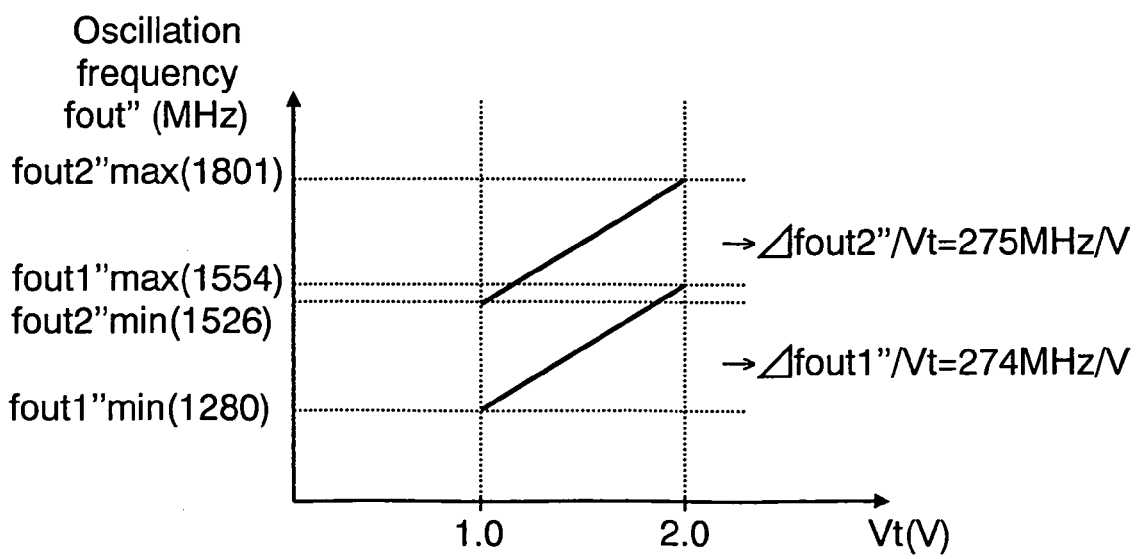
FIG. 9 shows oscillation frequency ranges when oscillation sensitivities are constant in a plurality of VCO circuits.

Note here that FIGS. 8 and 9 show oscillation sensitivities of VCO circuits, respectively. FIG. 8 shows a relation between the oscillation frequency and control voltage Vt when the oscillation sensitivities are not constant in the plurality of VCO circuits. FIG. 9 shows a relation between the oscillation frequency and control voltage Vt when the oscillation sensitivities are substantially constant in the plurality of VCO circuits. FIG. 8 shows the relation between the oscillation frequencies fout1 and fout2, which were already calculated above, and control voltage Vt.

In VCO circuit 1 and VCO circuit 2 shown in FIG. 5, capacitor (C10=C20=1.0 pF, C11=C21=20.0 pF) and variable capacitance element (at Vt=V1=10V, Cv10=Cv20=2.0 pF; and at Vt=V2=2.0V, Cv10=Cv20=1.0 pF) are provided in the same configuration and by changing only the constants of inductor 10 (=5.5 nH) and inductor 20 (=4.0 nH), different frequency ranges are obtained.

Herein, when the oscillation sensitivity of VCO circuit 1 is expressed by Δfout1/ΔVt and the oscillation sensitivity of VCO circuit 2 is expressed by Δfout2/ΔVt, Δfout1/ΔVt=(fout1 max−fout1 min)/(2.0−1.0)=302 MHz/V, and Δfout2/ΔVt=(fout2 max−fout2 min)/(2.0−1.0)=258 MHz/V are obtained, which show that the oscillation sensitivities are different from each other.

VCO circuit 1 having larger oscillation sensitivity is more susceptible to the influence of control voltage Vt and the phase noise is more likely to be deteriorated. Therefore, it becomes difficult to obtain a constant phase noise performance over a wide band of frequency range.

FIG. 9 shows a relation between the oscillation frequency and control voltage Vt when the oscillation sensitivities are substantially constant in the plurality of VCO circuits. The oscillation frequencies of VCO circuit 1 and VCO circuit 2 are denoted with fout1" and fout2", respectively.

For adjusting the individual oscillation frequencies, the inductors (L10 and L20) and capacitors (C11, C21) were used. The constant of these values after modification are L10=5.3 nH, L20=4.1 nH, C11=45.0 pF and C21=9.5 pF.

Herein, similar to the above, the oscillation sensitivities after modification are shown. When the oscillation sensitivity of VCO circuit 1 is expressed by fout1"/Δt and the oscillation sensitivity of VCO circuit 2 is expressed by fout2"/Δ, Δfout1"/ΔVt=(fout1"max−fout1"min)/(2.0−1.0)=274 MHz/V, and Δfout2"/ΔVt=(fout2"max−fout2"min)/(2.0−1.0)=275 MHz/V are obtained.

As is apparent from the above description, since the oscillation sensitivities of VCO circuit 1 and VCO circuit 2 are substantially the same, the influence of control voltage Vt on the phase noise is also constant, so that more constant phase noise performance can be obtained over a wide band of frequency range.

Note here that in the fourth exemplary embodiment, for the sake of convenience of description, since only one element of variable capacitance element is used so as to control the oscillation frequency at narrow control voltage Vt (1.0V to 2.0V), the oscillation sensitivity becomes extremely high. However, the oscillation sensitivity is preferably low. In particular, when a frequency range is allowed to oscillate over a wide band, the oscillation sensitivity may be lowered by using a configuration in which a plurality of elements, capable of varying capacitance values by the difference in potential applied to the element between the terminals, are connected in parallel.

Fifth Exemplary Embodiment

Figure 10:
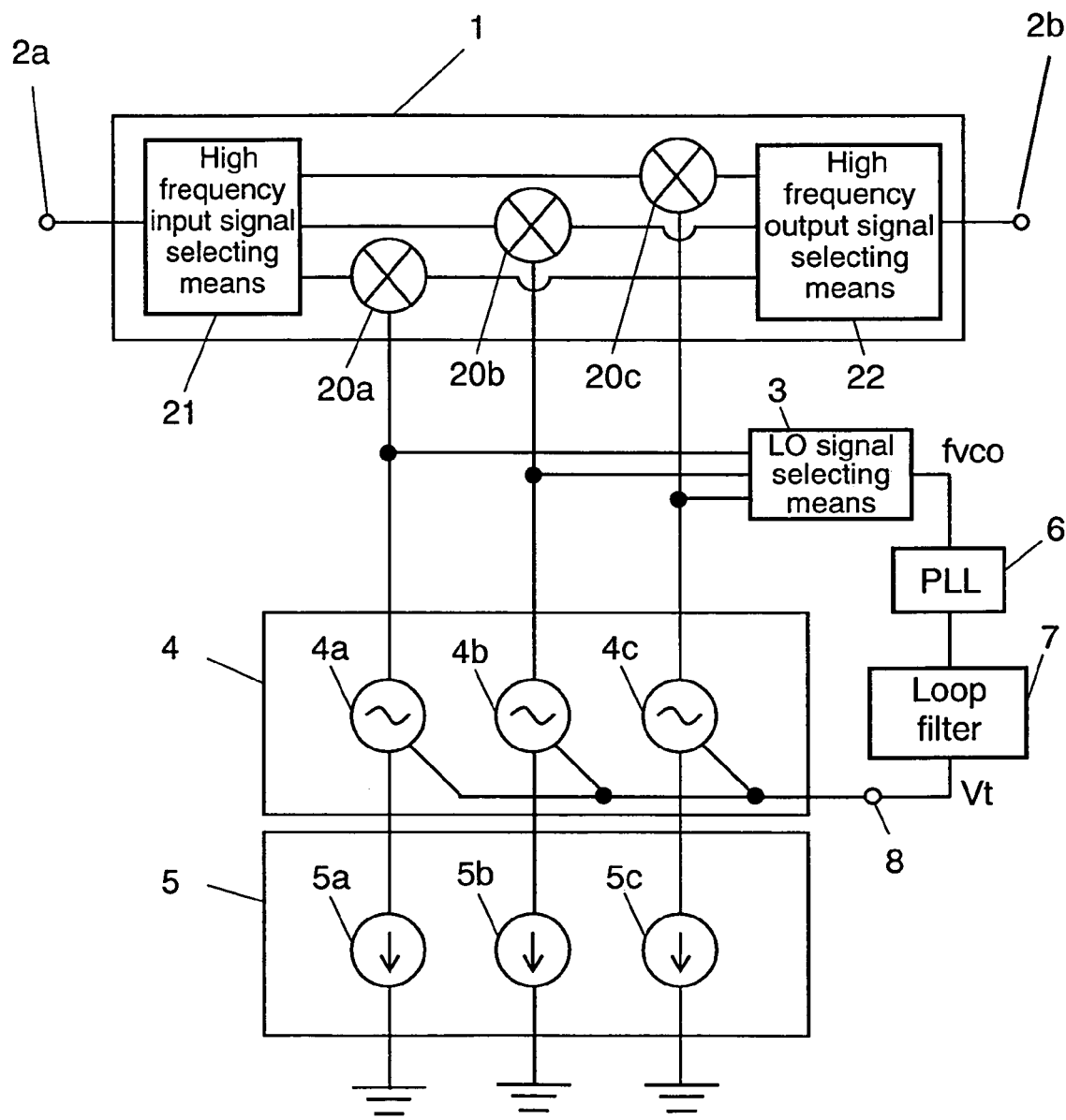
FIG. 10 is a circuit block diagram showing a VCO device in a further exemplary embodiment of the present invention.

FIG. 10 is a block diagram showing a further configuration of a VCO device. The same or corresponding elements shown in the first exemplary embodiment shown in FIG. 1 are denoted with the same reference numerals as those therein, and the detailed description thereof is omitted herein.

VCO circuit group 4 includes VCO circuits 4a, 4b and 4c, which oscillate in different oscillation frequency ranges from each other. LO signal selecting means 3 selects one local signal from three output signals (local signals) of VCO circuits 4a, 4b and 4c. PLL 6 frequency-divides local signal fvco selected by LO signal selecting means 3, compares a phase thereof with a phase of a reference signal, and outputs a voltage signal converted from a phase difference.

Loop filter 7 smoothes the output signal output from PLL 6 and generates control voltage Vt for controlling the oscillation frequency oscillated by VCO circuit. Control voltage Vt output from loop filter 7 controls the oscillation frequency oscillated by VCO circuit 4.

Fifth exemplary embodiment shown in FIG. 10 further includes a MIX circuit group consisting of a plurality of MIX circuits 20a, 20b and 20c. One input of the plurality of MIX circuits is connected to an output side of high frequency input signal selecting means 21. Furthermore, the other inputs of the plurality of MIX circuits are connected to output sides of VCO circuits 4a, 4b and 4c, respectively. Each of the output sides of the plurality of MIX circuits 20a, 20b and 20c is connected to high frequency output signal selecting means 22.

According to such a configuration, a frequency band for processing signals by individual MIX circuits which are respectively connected to the plurality of VCO circuits oscillating in different oscillation frequency ranges is not a wide band such as a television broadcast but a part obtained by dividing the wide band of range. Thereby, it is possible to obtain excellent communication characteristics at low power consumption without increasing the current consumption, which is a problem in widening the band of the MIX circuit.

Sixth Exemplary Embodiment

Figure 11:
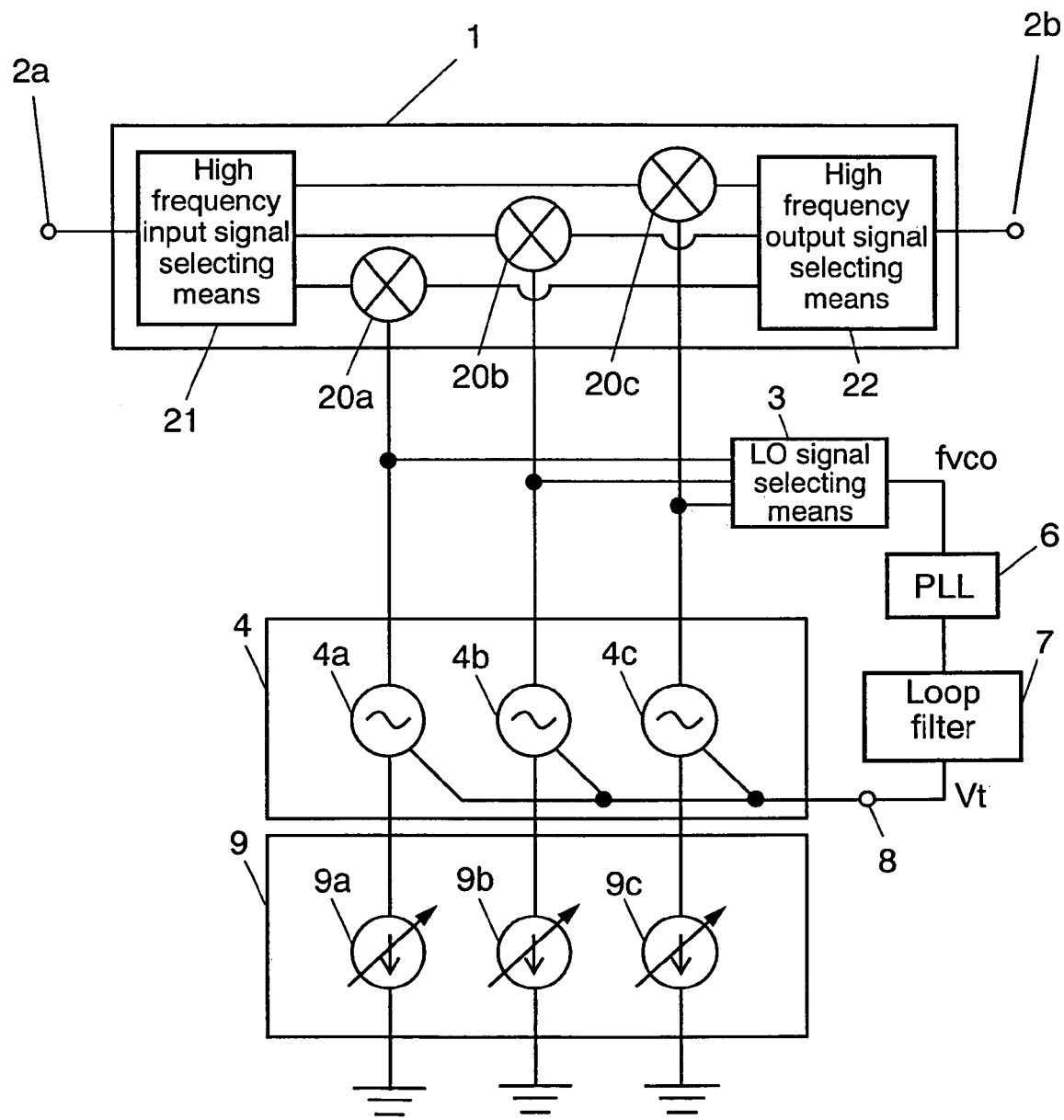
FIG. 11 is a circuit block diagram showing a VCO device in a further exemplary embodiment of the present invention.

FIG. 11 is a block diagram showing an example of a further configuration of a VCO device. The same or corresponding elements shown in the fifth exemplary embodiment shown in FIG. 10 are denoted with the same reference numerals as those therein, and the detailed description thereof is omitted herein.

VCO circuit group 4 includes VCO circuits 4a, 4b and 4c, which are configured to oscillate in different oscillation frequency ranges. Furthermore, current source circuit 9 is provided. Current source circuit 9 includes variable current source circuits 8a, 9b and 9c. Variable current source 8a is a diving current source of VCO circuit 4a. Similarly, variable current source 9b and variable current source 9c are provided for driving VCO circuit 4b and VCO circuit 4c, respectively.

When currents of variable current source circuits 8a, 9b and 9c are adjusted respectively so as to operate VCO circuits 4a, 4b and 4c, it is possible to obtain a VCO device having not only phase noise characteristics with respect to the oscillation frequency but also a plurality of required characteristics that are different depending upon the change in operation environment such as a temperature and power supply voltage, etc. and communication standards.

Seventh Exemplary Embodiment

Figure 12:
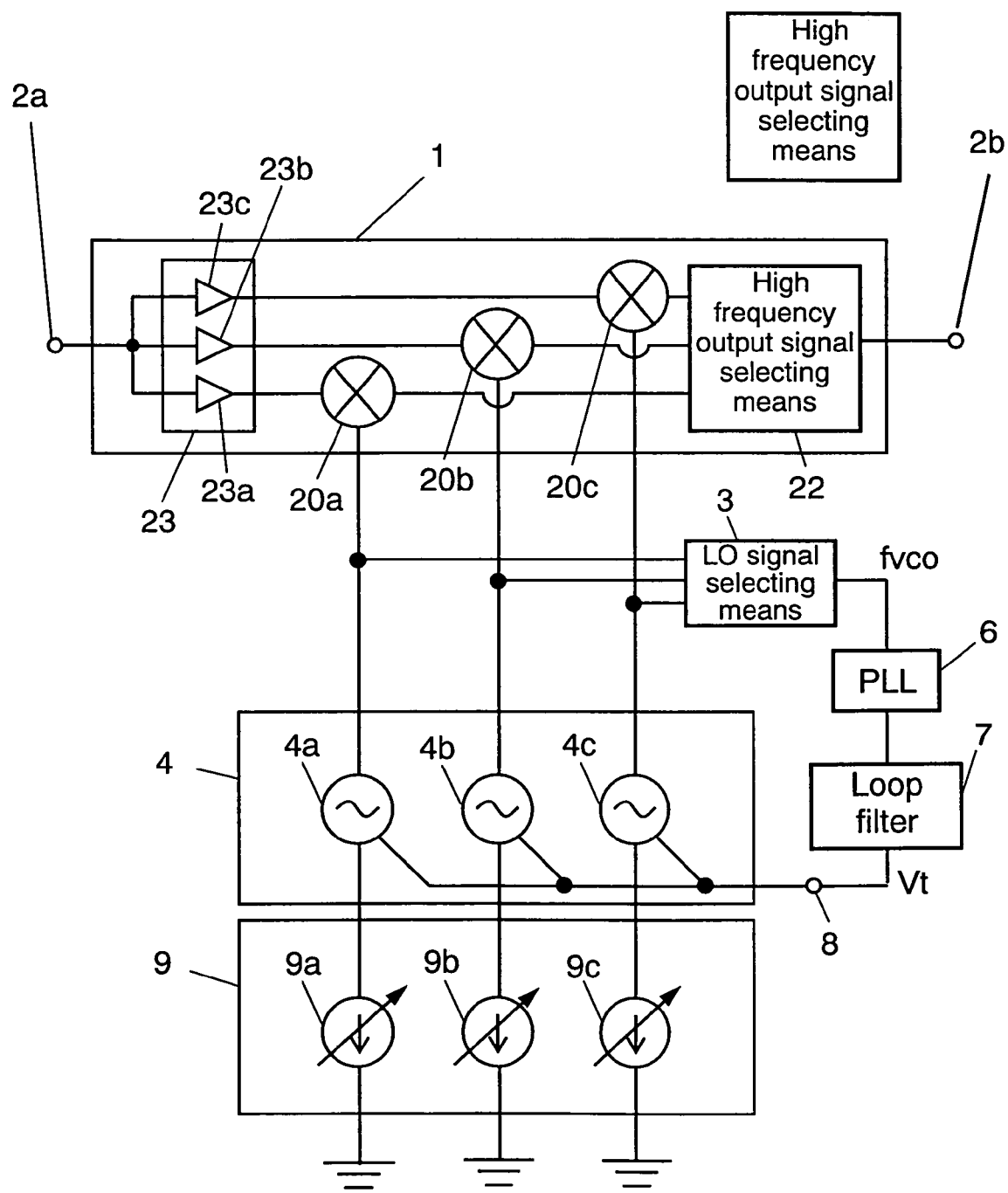
FIG. 12 is a circuit block diagram showing a VCO device in a further exemplary embodiment of the present invention.

FIG. 12 is a block diagram showing an example of a further configuration of a VCO device. The same or corresponding elements shown in the sixth exemplary embodiment shown in FIG. 11 are denoted with the same reference numerals as those therein, and the detailed description thereof is omitted herein.

To high frequency signal input terminal 2a, LNA group 23 is connected. LNA group 23 includes LNA23a, LNA23b and LNA23c which operate in different frequency bands, and are input to MIX circuits 20a, 20b and 20c, which operate in different frequency bands, for similarly signal-processing the output signals from these plurality of LNAs.

LNA23a, LNA23b and LNA23c are provided with switching functions for turning ON and OFF the operating power supplies, respectively (not shown). LNA whose power supply is turned ON amplifies the input signals supplied from high frequency signal input terminal 2a and outputs the amplified signals to MIX circuits 20a, 20b and 20c, respectively. High frequency output selecting means 22 selects the high frequency output signals output from MIX circuit 20a, 20b and 20c and outputs one of the selected high frequency output signals to high frequency signal output terminal 2b.

Note here that a band for processing signals by the individual LNAs is a part obtained by dividing a wide band of frequency range, and thereby it is possible to obtain excellent communication characteristics with low power consumption without increasing the current consumption, which is a problem in widening the bond of LNA.

Eighth Exemplary Embodiment

Figure 13:
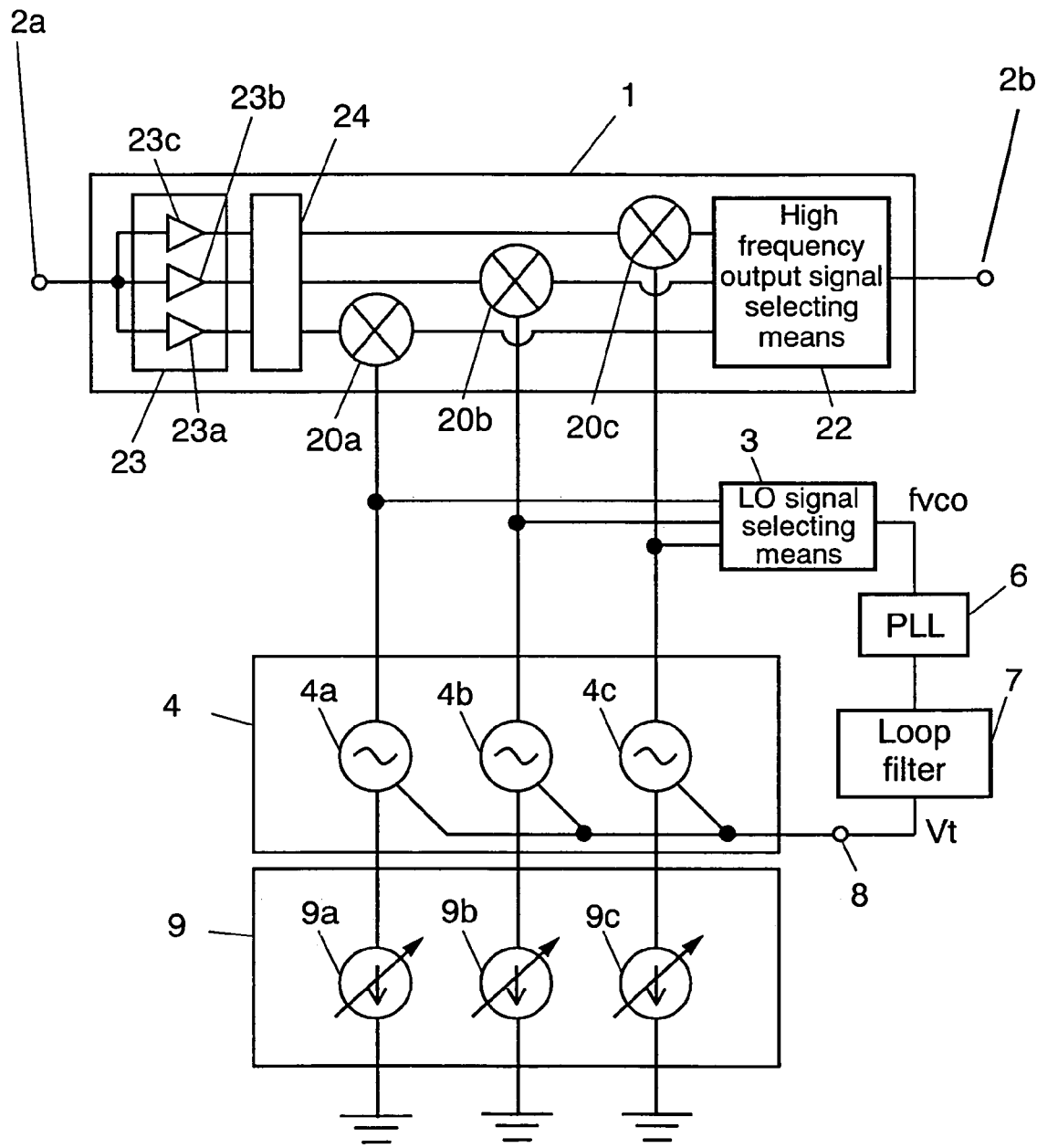
FIG. 13 is a circuit block diagram showing a VCO device in a further exemplary embodiment of the present invention.

FIG. 13 is a block diagram showing an example of a further configuration of a VCO device. The same or corresponding elements shown in the seventh exemplary embodiment shown in FIG. 12 are denoted with the same reference numerals as those therein, and the detailed description thereof is omitted herein.

This is different from FIG. 12 in that BPF (band pass filter) circuit 24 provided with a tuning function capable of selecting a frequency is connected to the output side of LNA group 23. As shown in FIG. 12, LNA group 23 includes three LNAs, i.e., LNA23a, LNA23b and LNA23c. Output signals from BPF circuit 24 are supplied to MIX circuits 20a, 20b and 20c.

When undesired interfering waves are included in a high frequency signal input to high frequency signal input terminal 2a, in particular, when electric field strength of the interfering waves is strong, by attenuating these interfering waves by the use of BPF circuit 24, excellent communication characteristics can be obtained.

Note here that in FIG. 13, BPF circuit 24 is disposed at the latter part of LNA group 23 but may be disposed at the former part of LNA group 23, that is, at the latter part of high frequency signal input terminal 2a. Furthermore, it may be disposed both at the former and latter parts of LNA group 23.

Ninth Exemplary Embodiment

Figure 14:
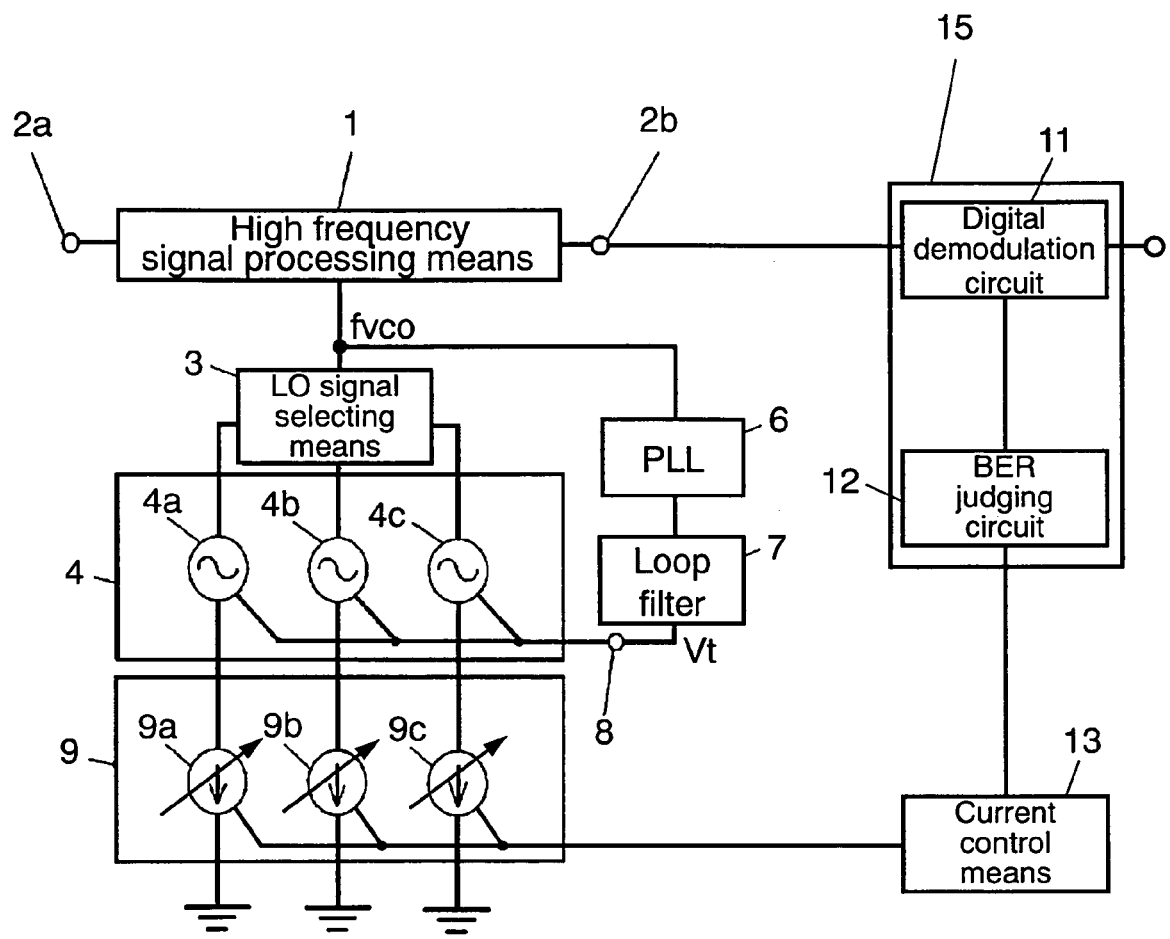
FIG. 14 is a circuit block diagram showing a VCO device in a further exemplary embodiment of the present invention.

FIG. 14 is a block diagram showing an example of a configuration of a receiver including a VCO device. Note here that the same or corresponding elements shown in the second exemplary embodiment shown in FIG. 3 are denoted with the same reference numerals as those therein, and the detailed description thereof is omitted herein.

The VCO device shown in FIG. 14 includes received characteristics judging means 15. Received characteristics judging means 15 includes digital demodulation processing circuit 11 and BER judging circuit 12.

The VCO device shown in FIG. 14 has substantially the same current control means 13 as that shown in FIG. 4. Digital demodulation circuit 11 carries out a digital demodulation processing of output signals supplied from high frequency signal output terminal 2b and detects Bit Error Rate (hereinafter, which refers to as "BER"). BER judging circuit 12 outputs a digital signal corresponding to the BER detection results. Note here that "BER" represents the quality of the received digital modulation signals and is a rate of bit errors included in the bit string received for a predetermined time.

Current control means 13 outputs an analog signal corresponding to a digital signal output from BER judging circuit 12 and adjusts the current of variable current source circuits 8a, 9b and 9c installed in current source circuit 9.

Then, as an example, as to how the current of variable current source circuit 9c of VCO circuit 4c shown in FIG. 14 is adjusted by digital demodulation processing circuit 11, BER judging circuit 12 and current control means 13 is described with reference to FIGS. 15 and 16.

Figure 15:
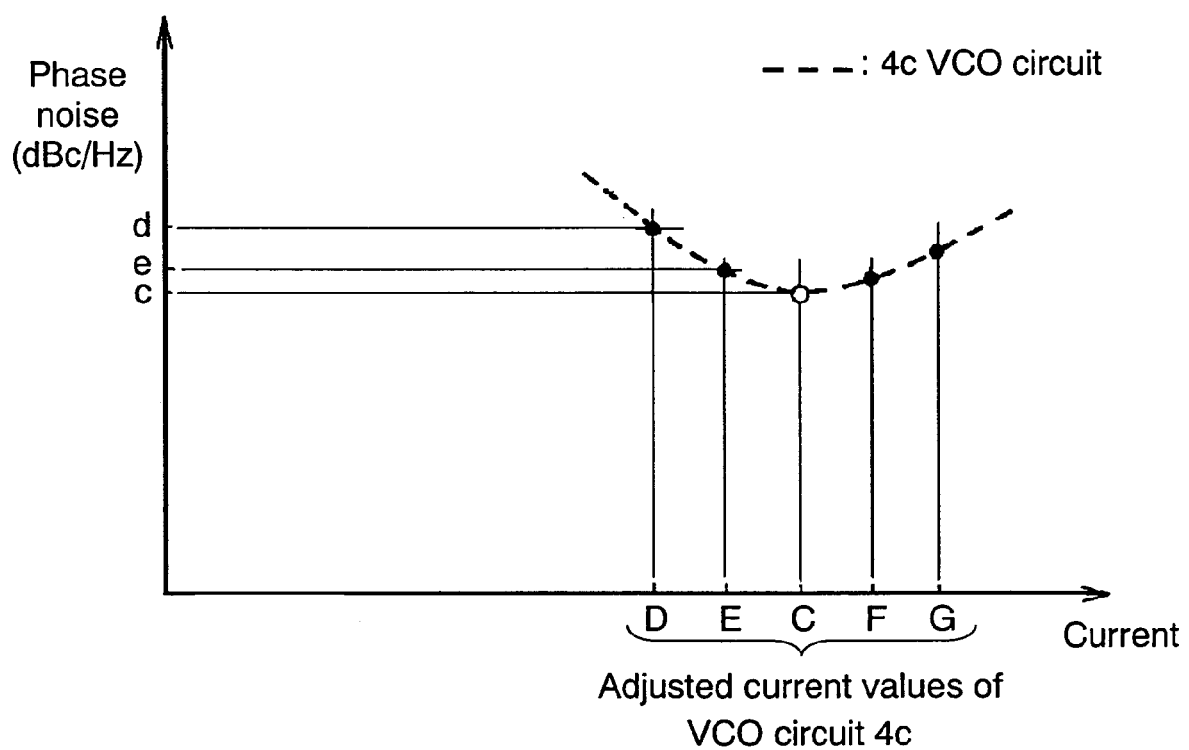
FIG. 15 is a correlation diagram between a phase noise and a driving current of a VCO circuit of the present invention.

FIG. 15 shows a relation between phase noise (c, d and e) of output signal FVCO and current (D, D and E) set by current source circuit 9c of VCO circuit 4c shown in FIG. 14 wherein axis of ordinate shows phase noise and axis of abscissa shows current. In FIG. 15, the relation between the above-mentioned phase noise and the above-mentioned current is shown by a cone-shaped characteristics curve with the minimum phase noise at current C. When the current is set to values shown by D and E smaller than C and set to values shown by F and G larger than C, the phase noise becomes larger in both directions.

Therefore, in general, it is preferable that the current is set to C for achieving an excellent receiving performance with a phase noise reduced. However, the relation between the phase noise and current is preferably readjusted based on so-called operation environment conditions such as surrounding temperature and power supply voltage. That is to say, it is noted that when the operation environment is changed, an optimum current for minimizing a phase noise is not current C. Therefore, in order to maintain the excellent receiving performance, the current of current source 9c is adjusted to be optimum corresponding to the change of the receiving performance so that the phase noise is minimized.

Figure 16:
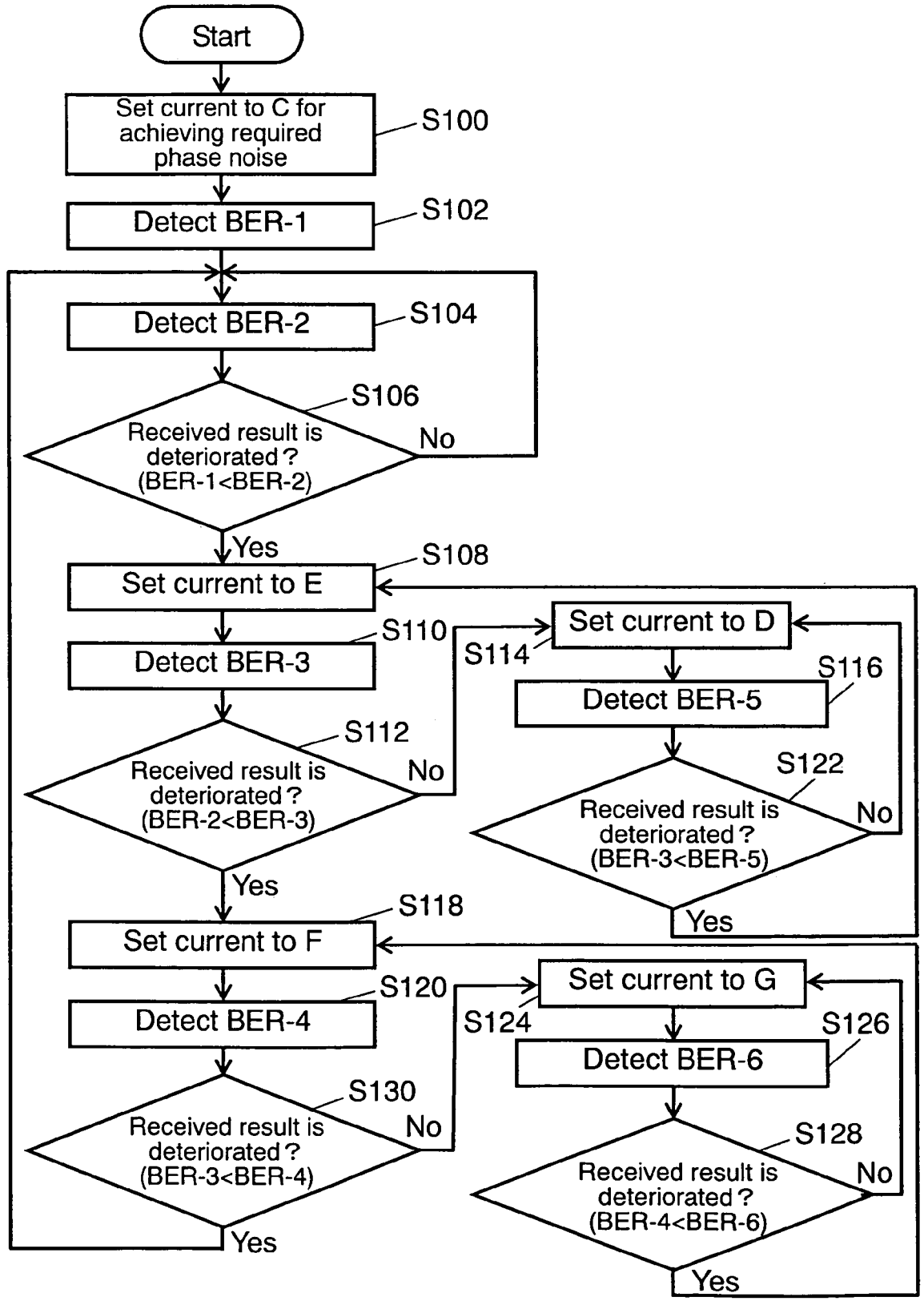
FIG. 16 is a flowchart showing an example of an operation for adjusting the current of a variable current source circuit of the present invention.

Then, a flowchart shown in FIG. 16 is described with reference to FIGS. 14 and 15. FIG. 16 is a flowchart showing a procedure for adjusting current. Note here that in a first step of the flowchart, that is, as an initial condition, variable current source circuit 9c of VCO circuit 4c shown in FIG. 15 is set to current C in which the phase noise becomes minimum (S100).

Then, digital demodulation processing circuit 11 carries out digital demodulation processing of signals output from high frequency signal output terminal 2b of a receiver including a VCO device so as to detect BER-1 (S102) and, a predetermined time later, detect BER-2 (S104).

As also described before, since "BER" represents a rate of bit errors included in the bit string received for a predetermined time, a predetermined time before and after, BERs are detected and compared with each other.

Judging circuit 12 compares BER-1 with BER-2, and judges that the received result is deteriorated when BER-2 is larger than BER-1 (S106). At this time, current control means 13 sets the current of variable current source circuit 9c to E that is lower than C for adjusting the relation between the phase noise and current (S108).

Then, similarly, a predetermined time after BER-2 is detected, BER-3 is detected (S110). When BER-3 is smaller than BER-2, it is judged that received result is improved (S112). At this time, the current of variable current source circuit 9c is set to D that is further lower than E. Similarly, after a predetermined time passed, BER-5 is detected (S116). When BER-5 is smaller than BER-3, it is judged that received result is improved. Operation is continued in a state in which the current is set to D (S114). When BER-5 is larger than BER-3, it is judged that the received result is further deteriorated. The current is returned to the state of E (S108).

Furthermore, when it is detected that BER-3 is larger than BER-2, it is judged that the received result is deteriorated. The current of variable current source circuit 9c is set to F from E (S118). Thereafter, BER-4 is detected (S120) and BER-3 and BER-4 are compared with each other (S130). When BER-4 is smaller than BER-3, it is judged that the received result is further deteriorated. The current is set to G that is further larger than F (S124). Then, BER-6 is detected (S126) and BER-4 and BER-6 are compared with each other (S128). When BER-6 is smaller than BER-4, it is judged that received result is improved. The operation is continued in a state in which the current is set to G (S124). When BER-6 is larger than BER-4, it is judged that received result is deteriorated. The operation is continued in a state in which the current is set to G (S118).

Hereinafter, similarly, while the detection and judgment of BER are carried out, the current of current source circuit 9 is adjusted corresponding to the change of the received result, whereby the phase noise characteristics of the VCO device are controlled.

As mentioned above, by adjusting the current of individual VCO circuits corresponding to the change in BER that represents the superiority or inferiority of characteristics of the receiver, it is possible to achieve a VCO device having excellent phase noise characteristics over a wide band by correcting the phase noise even if the operation environment such as a temperature and power voltage is changed.

Tenth Exemplary Embodiment

Figure 17:
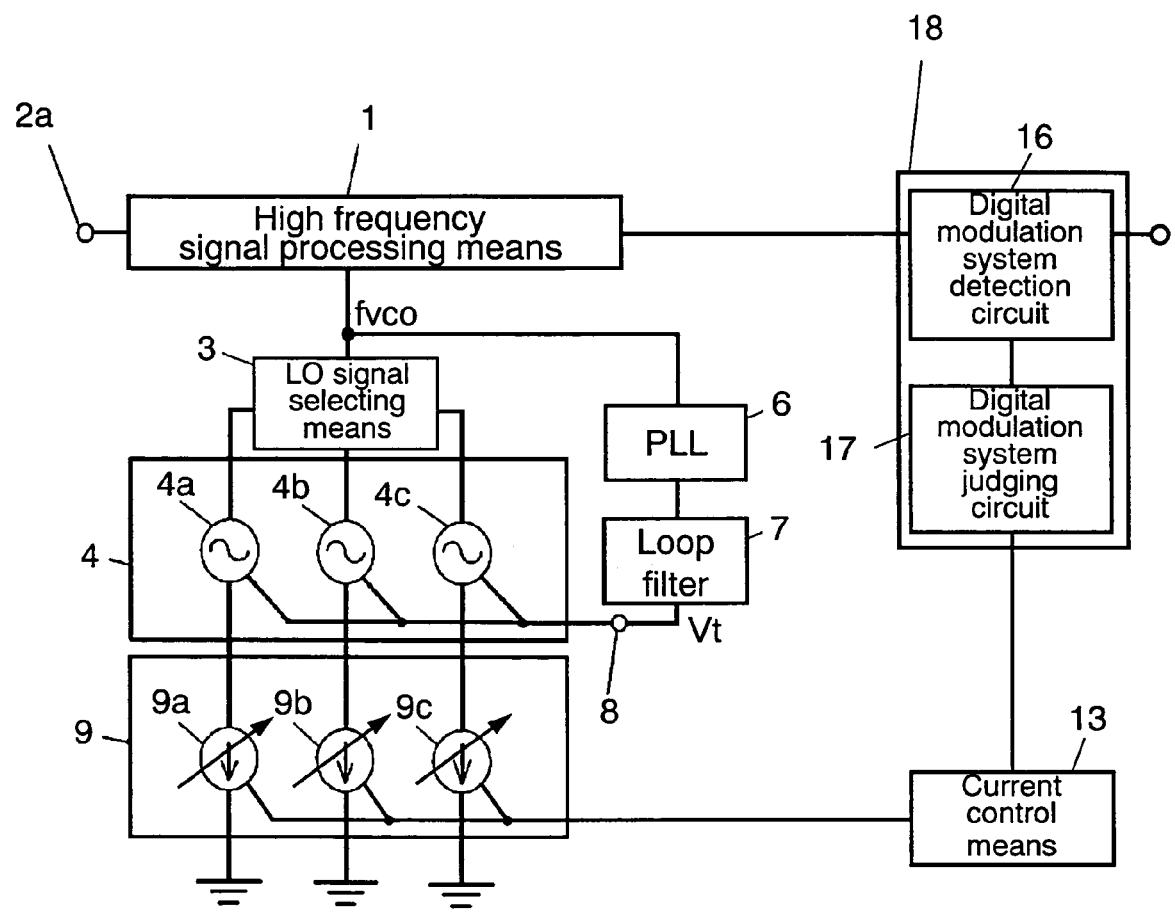
FIG. 17 is a circuit block diagram showing a VCO device of another exemplary embodiment of the present invention.

FIG. 17 is a block diagram showing an example of a configuration of a receiver including a VCO device. Note here that the same or corresponding elements shown in the second exemplary embodiment shown in FIG. 3 are denoted with the same reference numerals as those therein, and the detailed description thereof is omitted herein.

Furthermore, the tenth exemplary embodiment described with reference to FIG. 17 is different from the foregoing other exemplary embodiments in that digital modulation system judging means 18 is included. Digital modulation system judging means 18 includes digital modulation system detection circuit 16 and digital modulation system judging circuit 17. Digital modulation system detection circuit 16 detects a digital modulation system of an output signal output from high frequency signal output terminal 2b and carries out a digital demodulation processing.

Digital modulation system judging circuit 17 outputs an analog signal corresponding to a digital modulation system detected by digital modulation system detection circuit 16. FIG. 17 further includes current control means 13. Current control means 13 adjusts the current of variable current source circuits 8a, 9b and 9c provided in current source circuit 9 corresponding to the analog signal from digital modulation system judging circuit 17.

Then, an operation of adjusting the current of VCO circuit 4c by variable current source circuit 9c by way of digital modulation system detection circuit 16, digital modulation system judging circuit 17 and current control means 13 is described with reference to FIG. 15, FIG. 18 and FIG. 19.

Figures 18, 19:
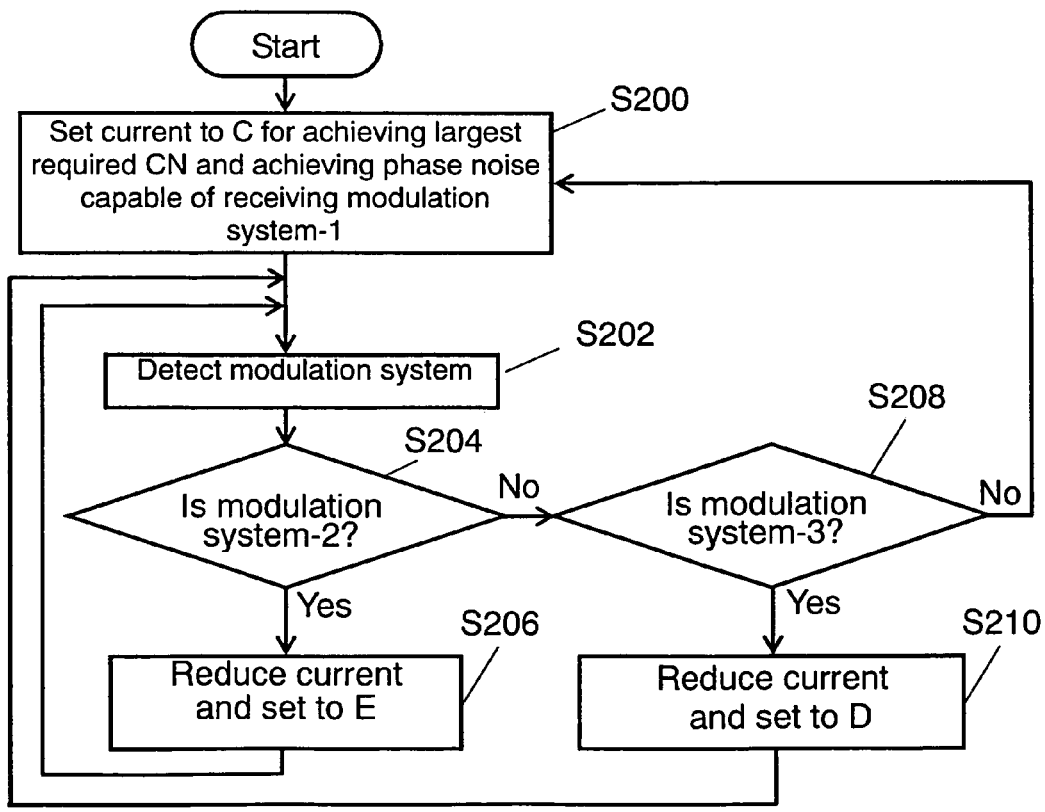
FIG. 18 is a correlation diagram between required a phase noise and the current of a VCO circuit corresponding to a digital modulation system of the present invention.
FIG. 19 is a flowchart showing an example of an operation of adjusting the current in accordance with a digital modulation system in the present invention.
Figure 20:
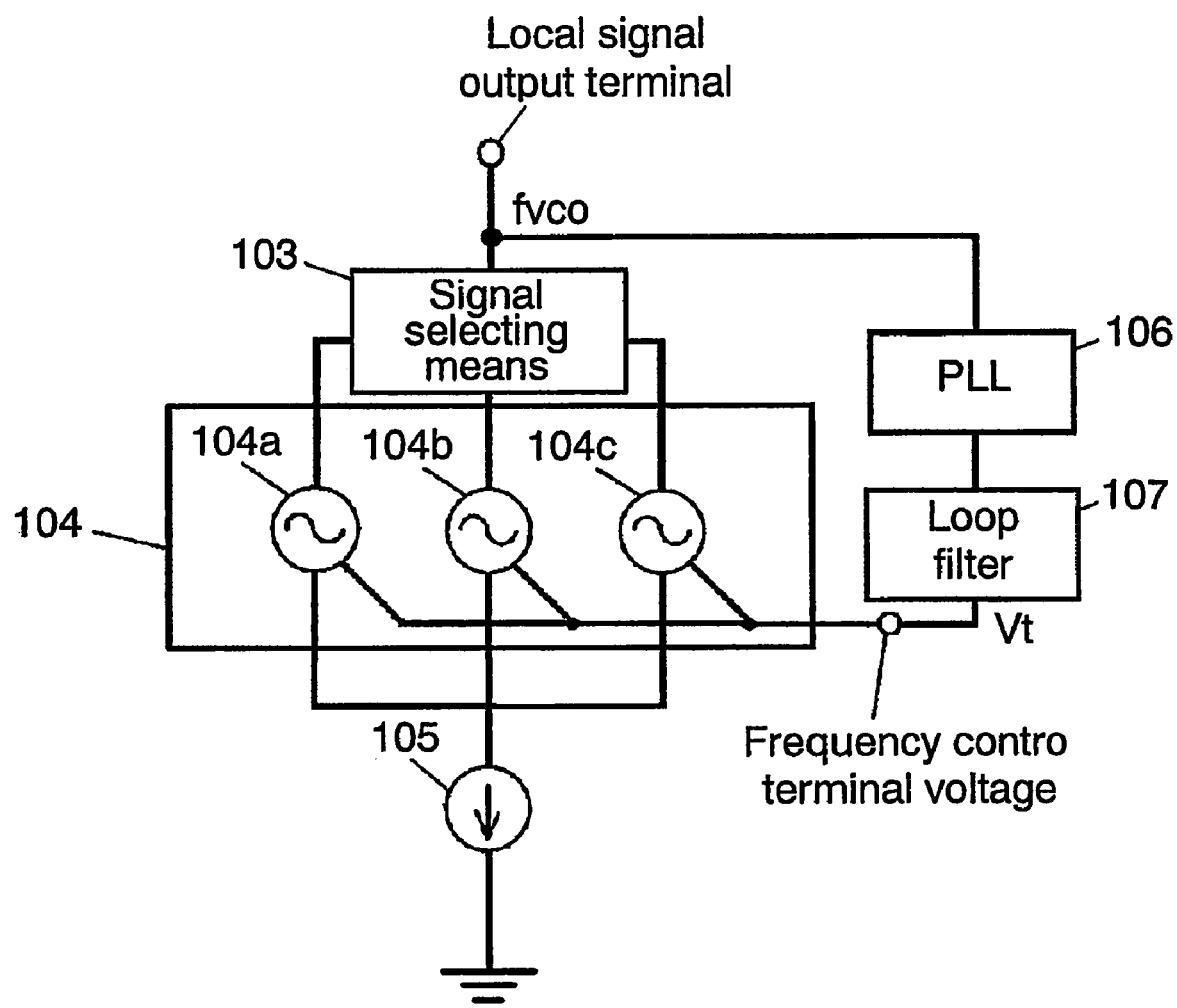
FIG. 20 is a circuit block diagram showing a conventional VCO device.
Figure 21:
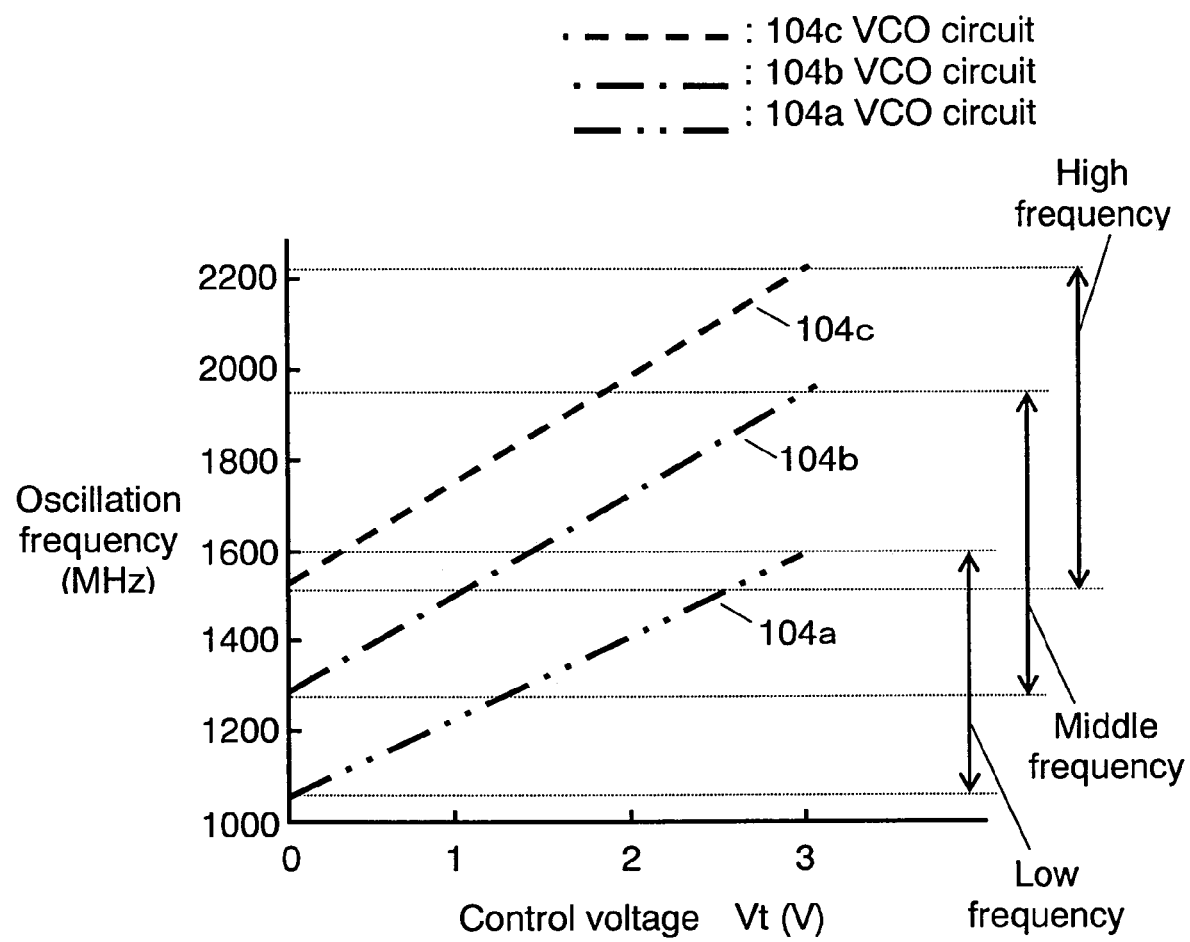
FIG. 21 is a characteristic view showing a relation between a control voltage and oscillation frequency in a conventional VCO device.
Figure 22:
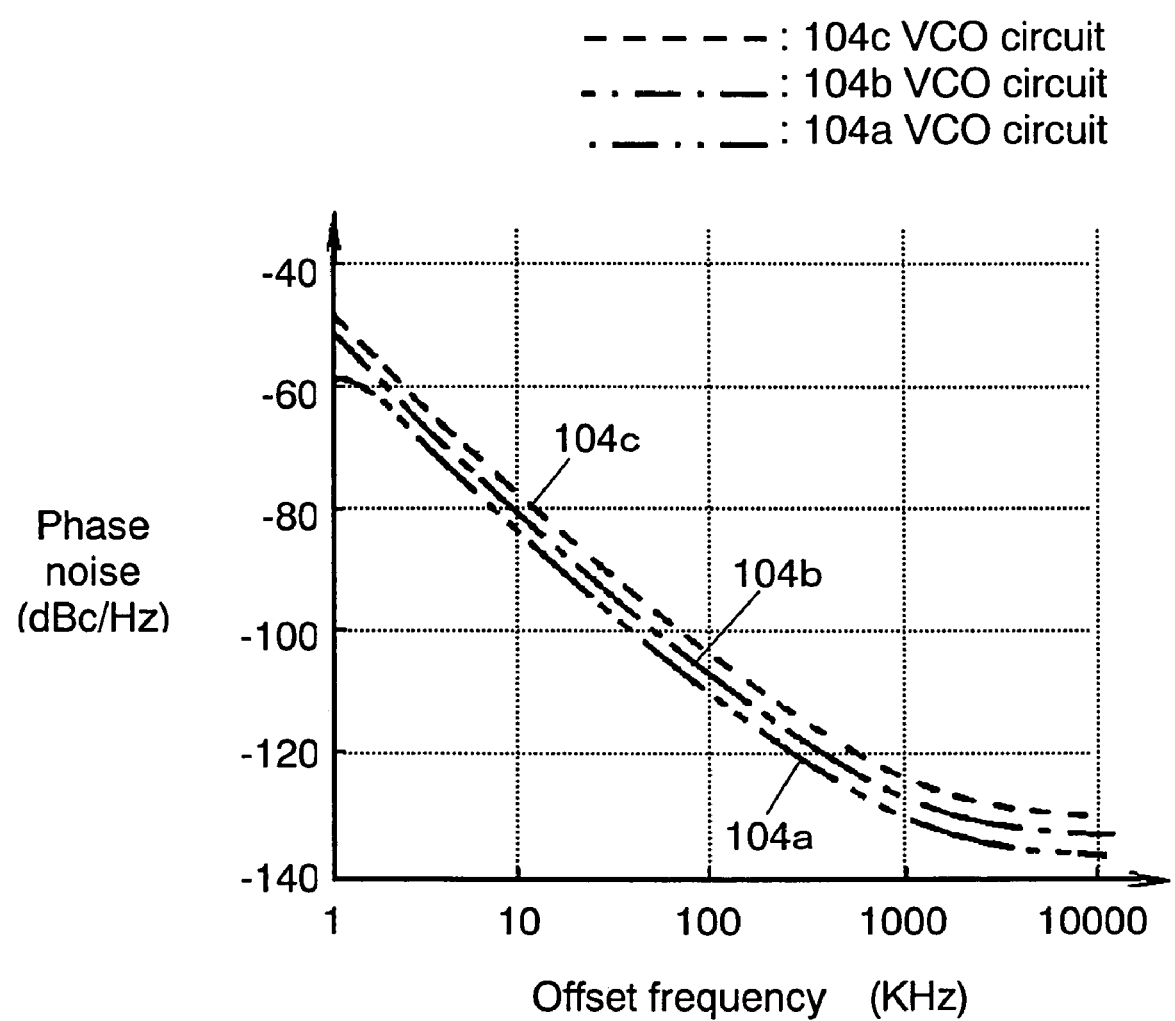
FIG. 22 is a characteristic view showing an offset frequency and a phase noise in a conventional VCO device.

FIG. 18 shows digital modulation systems (required CNR of a receiver) and the corresponding relation between required phase noise and current of a VCO circuit. Herein, it is assumed that digital modulation system (1), digital modulation system (2) and digital modulation system (3) are respectively different modulation multiplicities of 256 QAM, 16 QAM and QPSK.

In a general digital modulation system, a system such as 256 QAM having a high resolution and multiplexed modulation can improve the transmission speed per unit frequency band. However, it is necessary to secure a large signal-to-noise power ratio (CNR) of IF signal input from a transmission signal path through a high frequency signal processing section into a digital demodulation processing means.

In accordance with the digital modulation system of the received signal, a required CNR of a receiver and a required phase noise of a VCO device mounted on the receiver are determined. In recent radio communication, broadcast communication standards, in which transmission speeds and transmission quality are diversified by switching the modulation systems in accordance with the application or using environment, are present. Therefore, it is thought to be a suitable design to maintain a demodulation rate of digital demodulation processing with required characteristics suitable for respective modulation systems without specifying the noise phase of the VCO device mounted on the receiver to a predetermined value.

Then, as shown in FIG. 18, phase noise c, phase noise e and phase noise d respectively corresponding to modulation system (1), modulation system (2) and modulation system (3) are set and current of the VCO circuit is adjusted to C, E and D, whereby the effect of reducing current consumption can be obtained when a signal of digital modulation system with relatively small modulation multiplicity is received.

FIG. 19 is a flowchart showing an example of an operation for adjusting the above-mentioned current by a digital modulation system. First of all, variable current source circuit 9c of VCO circuit 4c is set to current C for achieving the largest, i.e., strictest required CNR and for achieving smaller phase noise c in the plurality of digital modulation systems (S200).

Then, digital demodulation processing circuit 11 detects digital modulation system (S202). When the detection result is modulation system (2) (S204), the current of variable current source circuit 9c is reduced to current E (S206) and phase noise e capable of maintaining the demodulation efficiency of modulation system (2) is realized.

When the modulation system is not modulation system (2), it is judged whether or not the modulation system is modulation system (3) (S208). When it is judged that the modulation system is modulation system (3), the current is set to further smaller current D (S210). When the modulation system is not modulation system (3), the current is set to current C again (S200).

Thereafter, similarly, a digital modulation system is detected. When the digital modulation system is a different modulation system, for example, modulation system (3) continues an operation in a state in which the current is set to the current of variable current source circuit suitable for the modulation system.

As mentioned above, the VCO device of the present invention can variably adjust the current of the individual VCO circuits corresponding to the received digital modulation systems when high frequency signals, using some different digital modulation signals, of broadcast standard or communication standard are received or transmitted.

For example, in the digital modulations, when the high frequency signal of a system such as 16 QAM, in which the references are relatively adjacent to each other and influence of signal deterioration due to a signal-to-noise power ratio (CNR) is large, is processed, the current of the VCO circuit is adjusted to increase. On the other hand, when the high frequency signal of a system such as QPSK, in which the references are not relatively adjacent to each other and the influence of signal deterioration due to a signal-to-noise power ratio (CNR) is small, is processed, the current of the VCO circuit is adjusted to positively reduce. Consequently, an effect of realizing a VCO device with a wide band and low current consumption can be obtained.

Note here that in the configuration of the exemplary embodiments of the present invention, three VCO circuits are provided. However, the present invention is not limited to this, and can be applied to a configuration of a VCO circuit device provided with two or more VCO circuits.

Furthermore, in the exemplary embodiments of the present invention, as a signal selecting means for switching a plurality of VCO circuits, only an example of using a switch circuit has been described. However, a configuration in which a plurality of configured VCO circuits are electrically isolated from each other can be used. In addition, a configuration in which a signal amplifying means is inserted between the VCO circuit and MIX can be used.

Furthermore, in the exemplary embodiments of the present invention, an example in which a configuration of high frequency signal processing means uses a single conversion system has been described. However, the VCO device of the present invention can be used for a configuration of a receiver including an orthogonal MIX by employing a double-conversion system or a direct-conversion system or an IQ output system.

Furthermore, in the exemplary embodiments of the present invention, as a current control means for switching currents of a variable current source circuit, a configuration of using a current control means has been described. However, it is also possible to use a regulator circuit provided with a current switching means or a current adjusting means for switching fixed current. sources by disposing a plurality of fixed current sources with different currents can be used. Furthermore, in a plurality of VCO circuits, current source circuits of a plurality of the VCO circuits other than the VCO circuit necessary for tuning may be turned OFF so that current does not flow therein.

Furthermore, in the exemplary embodiments of the present invention, only an example in which a VCO device is used for a receiver has been described. However, the VCO device of the present invention having an effect of realizing both a wide band of oscillation frequency range and low current consumption can be widely used for a communication system including a receiver and a transmitter. Furthermore, in mobile equipment such as a movable telephone capable of corresponding to a plurality of communication standards having different frequency bands and in particular using a battery as a power supply source, an effect of being able to continuously use transmitting/receiving of video data or audio data for a long time can be obtained. Furthermore, in the future, when small and light tuner is developed and the tuner is installed in mobile equipment such as a mobile telephone etc. using a battery as an electric power supply source, an effect of being able to continuously reproduce video data or audio data for a long time can be expected.

Furthermore, in the exemplary embodiments of the present invention, as a judging means for adjusting the current of the variable current source circuit, only a configuration using a judging index such as BER or a digital modulation system has been described. However, any other judging indexes can be used.

INDUSTRIAL APPLICABILITY

As mentioned above, since the present invention can provide a VCO device capable of achieving both a wide band of an oscillation frequency range and low power consumption, the industrial application value thereof is high.

The invention claimed is:

1. A Voltage-Controlled Oscillator ("VCO") device comprising:
   a plurality of VCO circuits configured to oscillate signals of frequencies corresponding to a control voltage applied to a frequency control voltage terminal, in different oscillation frequency ranges;
   a variable current source circuit configured to respectively set a driving current of each of oscillation transistors included in the plurality of VCO circuits;
   a signal selecting means configured to select an output signal from the plurality VCO circuits;
   a PLL configured to frequency-divide a local signal selected by the signal selecting means, compare a phase thereof with a phase of a reference signal and output a signal converted from a phase difference; and
   a loop filter configured to smooth the output signal from the PLL and output the control voltage for controlling the oscillation frequency.

2. The VCO device according to claim 1, wherein in order to equalize phase noises of the plurality of VCO circuits, based on a phase noise of an oscillation signal of a VCO circuit oscillating in a highest oscillation frequency range in the VCO circuits, current values of current source circuits of other VCO circuits are set.

3. The VCO device according to claim 1, further comprising a current control means for switching current of the variable current source circuit corresponding to the oscillation frequency output from the VCO circuit.

4. The VCO device according to claim 1 to 2, wherein oscillation frequencies, which are output from the plurality of VCO circuits respectively, partially overlap with each other and can be varied continuously into a required oscillation frequency range.

5. The VCO device according to claims 1 to 2, wherein each of the plurality of VCO circuits has substantially equal oscillation sensitivities by a change in the control voltage applied to the frequency control voltage terminal and a change in oscillation frequency corresponding to this control voltage.

6. The VCO device according to claim 1, further comprising:
   a high frequency signal processing means for mixing a local signal output from any one of the plurality of VCO circuits and a received signal input from a high frequency signal input terminal;
   a digital modulation system judging means for judging the digital modulation system by carrying out a digital modulation processing of an analog signal output from the high frequency processing means; and
   a current control means for switching currents of the variable current source circuit by outputting voltage or current corresponding to the digital signal output from the received characteristics judging means.

7. A Voltage-Controlled Oscillator ("VCO") device comprising:
   a plurality of VCO circuits configured to oscillate signals of frequencies corresponding to a control voltage applied to a frequency control voltage terminal, in different oscillation frequency ranges;
   a variable current source circuit configured to respectively set a driving current of each of oscillation transistors included in the plurality of VCO circuits;
   a signal selecting means configured to switch output signals of the VCO circuits;
   a PLL configured to frequency-divide a local signal selected by the signal selected by the signal selecting means, compare a phase thereof with a phase of a reference signal and outputting a signal converted from a phase difference; and
   a loop filter configured to smooth the output signal from the PLL and outputting the control voltage for controlling the oscillation frequency.

8. The VCO device according to claim 7, further comprising a high frequency input signal selecting means that includes a low noise amplifier, wherein the low noise amplifier has a power supply ON/OFF function.

9. The VCO device according to claim 8, wherein the high frequency input signal selecting means comprises a Band Pass Filter ("BPF") circuit disposed at a former part or a latter part or both at the former part and the latter part of the low noise amplifier and further the BPF circuit has a tuning function capable of selecting frequencies.

10. The VCO device according to claim 7, further comprising:
   a high frequency signal processing means for mixing a local signal output from any one of the plurality of VCO circuits and a received signal input from a high frequency signal input terminal;
   a received characteristics judging means for carrying out a digital demodulation processing of an analog signal output from the high frequency signal processing means so as to judge received characteristics; and
   a current control means for switching currents of the variable current source circuit by outputting voltage or current corresponding to the digital signal output from the received characteristics judging means.

* * * * *